US010741991B2

(12) United States Patent
Kumazaki et al.

(10) Patent No.: US 10,741,991 B2
(45) Date of Patent: Aug. 11, 2020

(54) NARROWBAND LASER APPARATUS AND SPECTRAL LINEWIDTH MEASURING APPARATUS

(71) Applicant: Gigaphoton Inc., Tochigi (JP)

(72) Inventors: Takahito Kumazaki, Oyama (JP); Keisuke Ishida, Oyama (JP); Hiroshi Furusato, Oyama (JP)

(73) Assignee: Gigaphoton Inc., Tochigi (JP)

( * ) Notice: Subject to any disclaimer, the term of this patent is extended or adjusted under 35 U.S.C. 154(b) by 72 days.

(21) Appl. No.: 15/973,896

(22) Filed: May 8, 2018

(65) Prior Publication Data

US 2018/0254600 A1 Sep. 6, 2018

Related U.S. Application Data

(63) Continuation of application No. PCT/JP2015/084621, filed on Dec. 10, 2015.

(51) Int. Cl.
*H01S 3/137* (2006.01)
*G01J 3/28* (2006.01)
(Continued)

(52) U.S. Cl.
CPC ............ *H01S 3/137* (2013.01); *G01J 3/0205* (2013.01); *G01J 3/027* (2013.01); *G01J 3/0218* (2013.01);
(Continued)

(58) Field of Classification Search
CPC .... H01S 3/137; H01S 3/10038; H01S 3/2251; H01S 3/2256; H01S 3/034;
(Continued)

(56) References Cited

U.S. PATENT DOCUMENTS 6,141,095 A * 10/2000 Allen ................ G01J 3/28
356/301
6,317,203 B1 * 11/2001 Wakabayashi ......... G01M 11/00
356/237.1
(Continued)

FOREIGN PATENT DOCUMENTS

EP 1 258 059 B1 4/2008
JP H05-007031 A 1/1993
(Continued)

OTHER PUBLICATIONS

International Search Report issued in corresponding International Application No. PCT/JP2015/084621; dated Mar. 1, 2016.
(Continued)

*Primary Examiner* — Xinning(Tom) Niu
(74) *Attorney, Agent, or Firm* — Studebaker & Brackett PC

(57) ABSTRACT

A narrowband laser apparatus may be provided with a laser resonator including optical elements for narrowing a spectral linewidth, a spectrometer configured to detect spectral intensity distributions of multiple pulses included in a pulsed laser beam output from the laser resonator, a spectral waveform producer configured to produce a spectral waveform by adding up the spectral intensity distributions of the multiple pulses, a device function storage configured to store a device function of the spectrometer, a wavelength frequency function generator configured to generate a wavelength frequency function which represents a frequency distribution of center wavelengths of the multiple pulses, and a deconvolution processor configured to perform deconvolution processing on the spectral waveform with the device function and the wavelength frequency function.

11 Claims, 29 Drawing Sheets

(51) Int. Cl.
*G03F 7/20* (2006.01)
*G01J 3/02* (2006.01)
*G01J 3/26* (2006.01)
*G01J 3/10* (2006.01)
*H01S 3/034* (2006.01)
*H01S 3/08* (2006.01)
*H01S 3/10* (2006.01)
*H01S 3/23* (2006.01)
*H01S 3/225* (2006.01)
*H01S 3/00* (2006.01)
*H01S 3/106* (2006.01)

(52) U.S. Cl.
CPC . *G01J 3/10* (2013.01); *G01J 3/26* (2013.01); *G01J 3/28* (2013.01); *G03F 7/70025* (2013.01); *G03F 7/70575* (2013.01); *G03F 7/70725* (2013.01); *H01S 3/034* (2013.01); *H01S 3/08004* (2013.01); *H01S 3/10061* (2013.01); *H01S 3/2308* (2013.01); *G01J 2003/2859* (2013.01); *H01S 3/005* (2013.01); *H01S 3/0078* (2013.01); *H01S 3/08009* (2013.01); *H01S 3/106* (2013.01); *H01S 3/10038* (2013.01); *H01S 3/10069* (2013.01); *H01S 3/225* (2013.01); *H01S 3/2251* (2013.01); *H01S 3/2256* (2013.01)

(58) Field of Classification Search
CPC ............. H01S 3/08004; H01S 3/10061; H01S 3/2308; H01S 3/225; H01S 3/005; H01S 3/0078; H01S 3/106; H01S 3/08009; H01S 3/10069; G03F 7/70575; G03F 7/70025; G03F 7/70725; G01J 2003/2859; G01J 3/0218; G01J 3/26; G01J 3/10; G01J 3/027; G01J 3/0205; G01J 3/28

See application file for complete search history.

(56) References Cited

U.S. PATENT DOCUMENTS

| | | |
|---|---|---|
| 2003/0227954 A1 | 12/2003 | Ariga et al. |
| 2004/0263844 A1 | 12/2004 | Rafac |
| 2007/0273852 A1 | 11/2007 | Arai |
| 2008/0037010 A1 | 2/2008 | Rafac |
| 2008/0285602 A1* | 11/2008 | Nagai ..................... H01S 3/134 372/20 |
| 2015/0380893 A1 | 12/2015 | Matsunaga et al. |

FOREIGN PATENT DOCUMENTS

| | | |
|---|---|---|
| JP | H08-210915 A | 8/1996 |
| JP | 2001-267673 A | 9/2001 |
| JP | 2001-317999 A | 11/2001 |
| JP | 2006-024855 A | 1/2006 |
| JP | 2007-536498 A | 12/2007 |
| JP | 4094307 B2 | 6/2008 |
| WO | 01/59889 A1 | 8/2001 |
| WO | 2014/192704 A1 | 12/2014 |

OTHER PUBLICATIONS nternational Preliminary Report on Patentability issued in corresponding International Application No. PCT/JP2015/084621; dated Jun. 12, 2018.

An Office Action mailed by the State Intellectual Property Office of the People's Republic of China dated Sep. 30, 2019, which corresponds to Chinese Patent Application No. 201580084190.2 and is related to U.S. Appl. No. 15/973,896.

* cited by examiner

NARROWBAND LASER APPARATUS AND SPECTRAL LINEWIDTH MEASURING APPARATUS

CROSS-REFERENCE TO RELATED APPLICATIONS

This application is a continuation application of International Application No. PCT/JP 2015/084621 filed on Dec. 10, 2015. The content of the application is incorporated herein by reference in its entirety.

BACKGROUND

1. Technical Field

The present disclosure relates to a narrowband laser apparatus and a spectral linewidth measuring apparatus.

2. Related Art

With miniaturization and high integration of a semiconductor integrated circuit, improvement of resolution is demanded in a semiconductor exposure apparatus (hereinafter, referred to as "exposure apparatus"). Accordingly, the wavelength of light emitted from a light source for exposure is being shortened. As the light source for exposure, a gas laser apparatus is used in place of an existing mercury lamp. As the gas laser apparatus for exposure, a KrF excimer laser apparatus that emits ultraviolet rays of a wavelength of 248 nm and an ArF excimer laser apparatus that emits ultraviolet rays of a wavelength of 193 nm are currently employed.

As a current exposure technology, liquid immersion exposure has been used in practice, wherein a gap between a projection lens on the exposure apparatus side and a wafer is filled with a liquid to change the refractive index of the gap, thereby shortening the apparent wavelength of the light source for exposure. In the liquid immersion exposure using the ArF excimer laser apparatus as the light source for exposure, ultraviolet rays having a wavelength of 134 nm in water is applied to the wafer. This technology is called ArF liquid immersion exposure or ArF liquid immersion lithography.

Because the spectral linewidth in natural oscillation of the KrF and ArF excimer laser apparatuses is so wide, about 350 pm to shout 400 pm, that a color aberration occurs in a laser beam (ultraviolet rays) as projected in a reduced size onto the wafer through the projection lens on the exposure apparatus side, degrading the resolution. Therefore, it is necessary to narrow the spectral linewidth of the laser beam emitted from the gas laser apparatus such that the color aberration becomes ignorable. Accordingly, a line narrowing module (LNM) having a line narrowing element is provided in a laser resonator of the gas laser apparatus. The line narrowing module achieves narrowing the spectral linewidth. Note that the line narrowing element may include an etalon, a grating and the like. The laser apparatus in which the spectral linewidth is narrowed in this way is called narrowband laser apparatus.

CITATIONS

Patent Documents

Patent Document 1: JP Patent No. 4094307
Patent Document 2: JPA No. H8-210915
Patent Document 3: JPA No. H5-007031

SUMMARY

A narrowband laser apparatus according to an aspect of the present disclosure may comprise a laser resonator, a spectrometer, a spectral waveform producer, a device function storage, a wavelength frequency function generator, and a deconvolution processor. The laser resonator may include optical elements for narrowing a spectral linewidth. The spectrometer may be configured to detect spectral intensity distributions of multiple pulses included in a pulsed laser beam output from the laser resonator. The spectral waveform producer may be configured to produce a spectral waveform by adding up the spectral intensity distributions of the multiple pulses. The device function storage may be configured to store a device function of the spectrometer. The wavelength frequency function generator may be configured to generate a wavelength frequency function which represents a frequency distribution of center wavelengths of the multiple pulses. The deconvolution processor may be configured to perform deconvolution processing on the spectral waveform with the device function and the wavelength frequency function.

A narrowband laser apparatus according to another aspect of the present disclosure may comprise a laser resonator, a spectrometer, a spectral waveform producer, a device function storage, a wavelength shifting processor, a waveform averaging processor, and a deconvolution processor. The laser resonator may include optical elements for narrowing a spectral linewidth. The spectrometer may be configured to detect spectral intensity distributions of multiple pulses included in a pulsed laser beam output from the laser resonator. The spectral waveform producer may be configured to produce a spectral waveform for each of the multiple pulses on the basis of the corresponding spectral intensity distribution. The device function storage may be configured to store a device function of the spectrometer. The wavelength shifting processor may be configured to shift wavelengths of the respective spectral waveforms produced by the spectral waveform producer so as to bring center wavelengths of the spectral waveforms substantially equal to each other. The waveform averaging processor may be configured to average the spectral waveforms after having the wavelengths shifted by the wavelength shifting processor. The deconvolution processor may be configured to perform deconvolution processing on the spectral waveforms averaged by the waveform averaging processor, with the device function.

A spectral linewidth measuring apparatus according to an aspect of the present disclosure may comprise a spectrometer, a spectral waveform producer, a device function storage, a wavelength frequency function generator, and a deconvolution processor. The spectrometer may be configured to detect spectral intensity distributions of multiple pulses included in a pulsed laser beam output from a laser resonator. The spectral waveform producer may be configured to produce a spectral waveform by adding up the spectral intensity distributions of the multiple pulses. The device function storage may be configured to store a device function of the spectrometer. The wavelength frequency function generator may be configured to generate a wavelength frequency function which represents a frequency distribution of center wavelengths of the multiple pulses. The deconvolution processor may be configured to perform deconvolution processing on the spectral waveform with the device function and the wavelength frequency function.

BRIEF DESCRIPTION OF DRAWINGS

Some embodiments of the present disclosure will be described as an example below with reference to the accompanying drawings.

EMBODIMENTS

Contents

Figure 1:
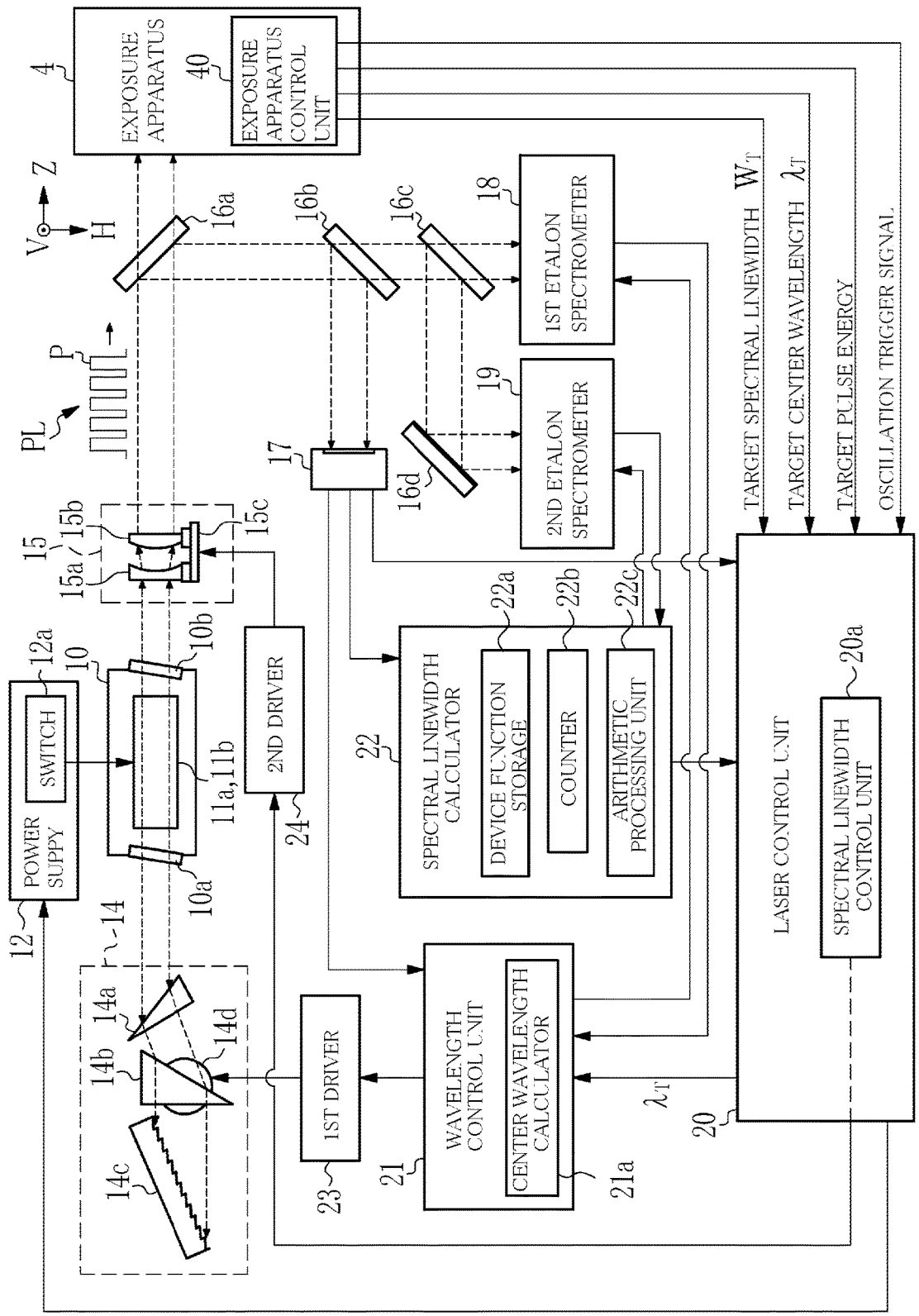
FIG. 1 schematically illustrates a configuration of a narrowband laser apparatus according to a comparative example.

1. Comprehensive Explanation of Narrowband Laser Apparatus of Comparative Example
1.1 Laser Chamber
1.2 Line Narrowing Module
1.3 Spectral Linewidth Modifier
1.4 Energy Sensor
1.5 First Etalon Spectrometer
1.6 Second Etalon Spectrometer
1.7 Exposure Apparatus
1.8 Laser Control Unit
1.9 Wavelength Control Unit
1.10 Definition of Center wavelength
1.11 Spectral Linewidth Calculator
1.12 Definition of Spectral Linewidth
1.13 Spectral Linewidth Control Unit
1.14 Output Pattern of Pulsed laser beam
1.15 Operation
1.15.1 Wavelength Control
1.15.2 Spectral Linewidth Control
1.15.3 Process for Calculating Spectral Linewidth
2. Problem
3. Narrowband Laser Apparatus Measuring Spectral Linewidth Taking Account of Center Wavelength of Each Pulse (First Embodiment)
3.1 Configuration
3.2 Operation
3.2.1 Process for Calculating Spectral Linewidth
3.2.2 Process for Generating Wavelength Frequency Function
3.3 Effect 3.4 Modification Relating to Wavelength Frequency Function Generation
3.4.1 First Modification
3.4.2 Second Modification
3.5 Modification Relating to Numbers for Integration and Averaging
3.6 Modification Relating to Production of Observed Spectral Waveform
4. Narrowband Laser Apparatus Measuring Spectral Linewidth Taking Account of Center Wavelength and Pulse Energy of Each Pulse (Second Embodiment)
4.1 Configuration
4.2 Operation
4.2.1 Process for Generating Wavelength Frequency Function
4.3 Effect
4.4 Modification
5. Narrowband Laser Apparatus Calculating Measured Spectral Linewidth While Shifting Wavelength of Each Spectral Waveform (Third Embodiment)
5.1 Operation
5.1.1 Process for Calculating Spectral Linewidth
5.2 Effect
5.3 Variation of Center Wavelength for Use in Wavelength Shifting
6. Variation of Second Etalon Spectrometer (Fourth Embodiment)
7. Narrowband Laser Apparatus Controlling Spectral Linewidth by Synchronization between MO and PO (Fifth Embodiment)
8. Configuration of Control Unit
8.1 Configuration
8.2 Operation In the following, some embodiments of the present disclosure will be described in detail with reference to the drawings. The embodiments described below each illustrate one example of the present disclosure and are not intended to limit the contents of the present disclosure. Also, all of the configurations and operations described in the embodiments are not necessarily essential for the configurations and operations of the present disclosure. Note that like elements are denoted with the same reference numerals and any redundant description thereof is omitted.

Figure 2:
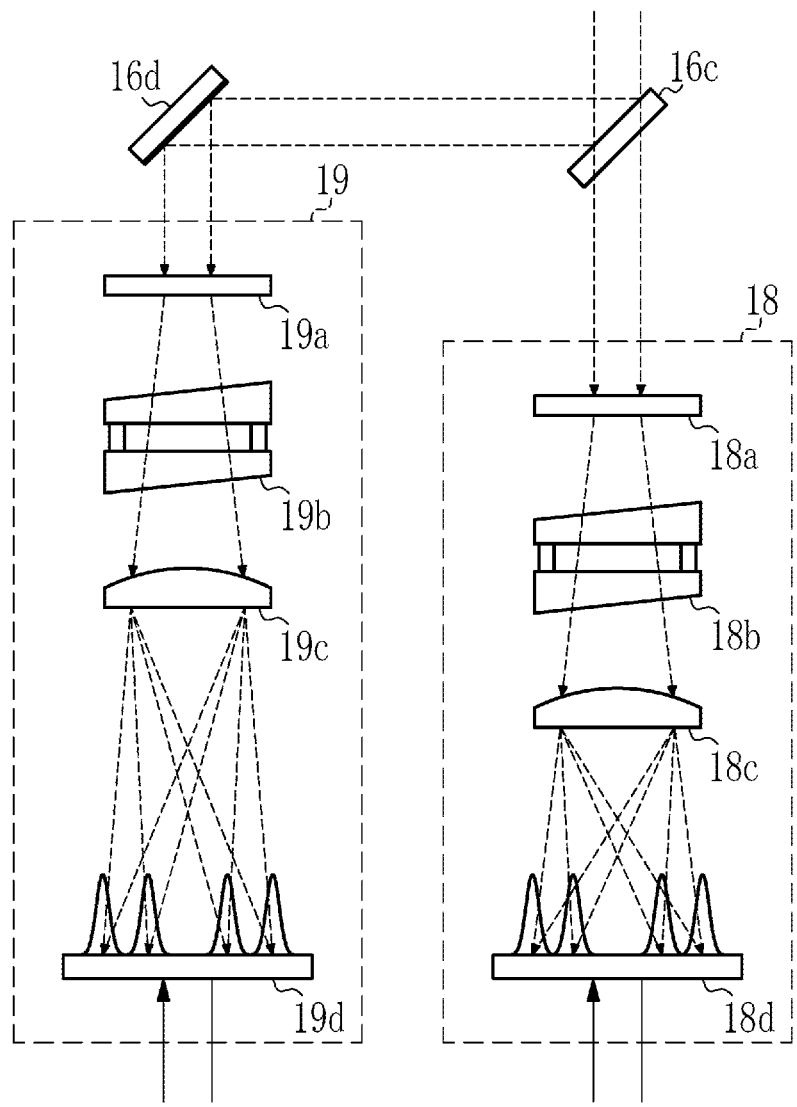
FIG. 2 illustrates concrete configurations of a first etalon spectrometer 18 and a second etalon spectrometer 19, which are shown in FIG. 1.

1. Comprehensive Explanation of Narrowband Laser Apparatus of Comparative Example FIG. 1 schematically shows a configuration of a narrowband laser apparatus according to a comparative example. FIG. 2 shows concrete configurations of a first etalon spectrometer 18 and a second etalon spectrometer 19, which are shown in FIG. 1.

The narrowband laser apparatus shown in FIG. 1 may include a laser chamber 10, a pair of discharge electrodes 11a and 11b, a power supply 12, and a laser resonator which may consist of a line narrowing module 14 and a spectral linewidth modifier 15.

In addition, the narrowband laser apparatus may include a first beam splitter 16a, a second beam splitter 16b, a third beam splitter 16c, a high reflection mirror 16d, and an energy sensor 17. The narrowband laser apparatus may further include the first etalon spectrometer 18, the second etalon spectrometer 19, a laser control unit 20, a wavelength control unit 21, a spectral linewidth calculator 22, a first driver 23, and a second driver 24. The narrowband laser apparatus may be a master oscillator which outputs seed light by laser oscillation and lets the seed light enter an amplifier (not illustrated).

The spectral linewidth modifier 15 may output a laser beam in a traveling direction that may be Z direction. A discharging direction between the pair of discharge electrodes 11a and 11b may be V direction or −V direction. A direction perpendicular to both the traveling direction and the discharging direction may be H direction. The −V direction may substantially coincide with the direction of the barycenter.

The laser chamber 10 may be a chamber encapsulating a laser gas therein, the laser gas containing, for example, argon gas or krypton gas as a rare gas fluorine gas or chlorine as a halogen gas, and neon gas or helium gas as a buffer gas. Windows 10a and 10b may be provided on opposite ends of the laser chamber 10.

The pair of discharge electrodes 11a and 11b, as electrodes for exciting a laser medium through electric discharge, may be disposed in the laser chamber 10. A pulsed high voltage from the power supply 12 may be applied across the pair of discharge electrodes 11a and 11b. The power supply 12 may include a charger (not illustrated) and a pulse power module (not illustrated). The pulse power module may include a switch 12a. When an oscillation trigger signal from the laser control unit 20 is applied to the switch 12a, the power supply 12 may generate the above-mentioned pulsed high voltage to be applied across the pair of discharge electrodes 11a and 11b.

When the high voltage is applied across the pair of discharge electrodes 11a and 11b, the discharge can occur between the pair of discharge electrodes 11a and 11b. The energy of the discharge can excite the laser medium in the laser chamber 10 to a high energy level. Thereafter when the excited laser medium transits to a low energy level, the laser medium can emit light corresponding to the difference in energy level.

The windows 10a and 10b may be arranged such that a plane of incident of light entering each window substantially coincides with the HZ plane and the incident angle of the light is substantially equal to the Brewster's angle. Light generated in the laser chamber 10 may be output as a pulsed laser beam PL through the windows 10a and 10b to the outside of the laser chamber 10. The pulsed laser beam PL may include multiple pulses P. The pulse P may be laser light generated from the laser chamber 10 in response to one oscillation trigger signal.

1.2 Line Narrowing Module

The line narrowing module 14 may include two prisms 14a and 14b, a grating 14c and a rotary stage 14d. The prisms 14a and 14b may enlarge the beam width in the H direction of the light output from the window 10a of the laser chamber 10, and may then direct the light to enter the grating 14c. Furthermore, the prisms 14a and 14b may reduce the beam width in the H direction of reflected light from the grating 14c, and may direct the reflected light back into a discharge space inside the laser chamber 10 through the window 10a.

The grating 14c may have a surface made of a material having a high reflectivity and the surface may have a large number of grooves formed at predetermined intervals. The grating 14c may be a dispersive optical element. Each groove may be a right triangle groove, for example. The light from the prisms 14a and 14b may fall on the grating 14c and reflected by these grooves, being diffracted in a direction that depends on the wavelength of the light. The grating 14c may be arranged in a Littrow arrangement such that the incident angle of the light from the prism 14a and 14b onto the grating 14c can coincide with the diffraction angle of those diffracted rays having a desired wavelength. Thus, rays around the desired wavelength can be returned to the laser chamber 10 through the prisms 14a and 14b.

The rotary stage 14d holds the prism 14b and causes the prism 14b to turn around an axis that is parallel to the V direction. The incident angle of light to the grating 14c can be changed by turning the prism 14b. Accordingly, it is possible to select the wavelength of rays to be returned from the grating 14c through the prisms 14a and 14b to the laser chamber 10.

The spectral linewidth of the laser beam generated by the line narrowing module 14 may be in a range of 200 to 400 fm inclusive and may preferably be 300 fm.

1.3 Spectral Linewidth Modifier

The spectral linewidth modifier 15 may include a planoconcave cylindrical lens 15a and a planoconvex cylindrical lens 15b. The planoconcave cylindrical lens 15a may be disposed nearer to the laser chamber 10 than the planoconvex cylindrical lens 15b. These lenses may be arranged such that the concave side of the planoconcave cylindrical lens 15a faces the convex side of the planoconvex cylindrical lens 15b. The planoconcave cylindrical lens 15a may be movable in the Z direction or −Z direction by means of a linear stage 15c. The linear stage 15c may be driven by the second driver 24.

The flat side of the planoconvex cylindrical lens 15b may be coated with a partial reflection film. Therefore, the spectral linewidth modifier 15 including the planoconvex cylindrical lens 15b may transmit and output one part of the light output through the window 10b of the laser chamber 10, and may reflect another part of the light back into the laser chamber 10.

By moving the planoconcave cylindrical lens 15a in the Z direction or −z direction, it is possible to adjust the wave surface of the light, which is output from the laser chamber 10 to the spectral linewidth modifier 15 and is returned from the spectral linewidth modifier 15 to the laser chamber 10. By adjusting the wave surface, the spectral linewidth of rays selected by the line narrowing module 14 may be modified.

The line narrowing module 14 and the spectral linewidth modifier 15 may constitute an optical resonator. The light that has been output from the laser chamber 10 can be reciprocated between the line narrowing module 14 and the spectral linewidth modifier 15, and may be amplified every time the light passes through the discharge space between the discharge electrodes 11a and 11b, to cause laser oscillation. The spectral linewidth of the laser beam can be narrowed every time the laser beam is returned by the line narrowing module 14. Furthermore, the abovementioned arrangement of the windows 10a and 10b makes it possible to select light components polarized in the H direction. The light amplified this way can be output as the pulsed laser beam PL from the spectral linewidth modifier 15 toward the exposure apparatus 4.

The first beam splitter 16a may be disposed in an optical path of the pulsed laser beam PL between the spectral linewidth modifier 15 and the exposure apparatus 4. The first beam splitter 16a may transmit the pulsed laser beam, which has been output from the spectral linewidth modifier 15, at high transmittance, while reflecting a part of the pulsed laser beam which has been output from the spectral linewidth modifier 15. A second beam splitter 16b may be disposed in the optical path of the pulsed laser beam reflected from the first beam splitter 16a. The second beam splitter 16b may transmit a part of the pulsed laser beam which has been reflected from the first beam splitter 16a, and may reflect another part of the pulsed laser beam which has been reflected from the first beam splitter 16a.

1.4 Energy Sensor

The energy sensor 17 may be disposed in an optical path of the pulsed laser beam which has been reflected from the second beam splitter 16b. The energy sensor 17 may measure pulse energy of each pulse P of the pulsed laser beam PL which has been reflected from the second beam splitter 16b. The energy sensor 17 may output data on the measured pulse energy to the laser control unit 20. When detecting the pulse energy, the energy sensor 17 may also output a detection signal to the wavelength control unit 21 and the spectral linewidth calculator 22, the detection signal indicating that the energy sensor 17 detects one pulse P. The energy sensor 17 may be a photodiode, a photoelectric tube, or a pyroelectric element.

1.5 First Etalon Spectrometer

A third beam splitter 16c may be disposed in an optical path of the pulsed laser beam PL which has been transmitted through the second beam splitter 16b. The third beam splitter 16c may transmit a part of the pulsed laser beam. PL which has been transmitted through the second beam splitter 16b, and may reflect another part of the pulsed laser beam PL which has been transmitted through the second beam splitter 16b. The light quantity of the pulsed laser beam PL transmitted through the third beam splitter 16c may be greater than the light quantity of the pulsed laser beam PL which has been reflected by the third beam splitter 16c.

The first etalon spectrometer 18 may be disposed in an optical path of the pulsed laser beam PL which has been transmitted through the third beam splitter 16c. Referring to FIG. 2, the first etalon spectrometer 18 may include a diffusion plate 18a, an etalon 18b, a light condensing lens 18c, and a line sensor 18d. The first etalon spectrometer 18 may be used for measuring the wavelength of each pulse P of the pulsed laser beam. PL.

The diffusion plate 18a may be a transmissive optical element having multiple concavity and convexity on a surface thereof. The pulsed laser beam PL incident on the diffusion plate 18a may be transmitted therethrough as scattering light. The scattering light transmitted through the diffusion plate 18a may enter the etalon 18b.

The etalon 18b may be an air-gap etalon which includes two partial reflection mirrors each having a predetermined reflectance R. In the air-gap etalon, the two partial reflection mirrors may face each other with a predetermined air gap in between, and may be bonded to each other with a spacer in between.

There is an optical path difference between light transmitted through the etalon 18b without being reciprocated between the two partial reflection mirrors, on one hand, and light transmitted through the etalon 18b after being reciprocated between the two partial reflection mirrors, on the other hand. The optical path difference can vary depending on the incident angle θ of light incident on the etalon 18b. The light incident on the etalon 18b can be transmitted through the etalon 18b at high transmittance when the abovementioned optical path difference is an integer "m" multiple of the wavelength λ of the incident light.

A basic formula applied to the etalon 18b is as follows:

$$m\lambda = 2nd \cos\theta \tag{1}$$

Here, d may be a distance of the air gap, and n may be a refractive index in the air gap.

The light having the wavelength λ and being incident on the etalon 18b can be transmitted through the etalon 18b at high transmittance when the incident angle θ of the light satisfies formula (1) above. Accordingly, the incident angle θ at which light can be transmitted through the etalon 18b at high transmittance can vary depending on the wavelength of the light incident on the etalon 18b. The light transmitted through the etalon 18b may enter the light condensing lens 18c.

The light condensing lenses 18c may be an optical element having light condensing capability. The light transmitted through the light condensing lens 18c may enter the line sensor 18d which is disposed at a distance corresponding to the focal length from the light condensing lens 18c. The light transmitted through the light condensing lens 18c can form an interference pattern on the line sensor 18d.

The line sensor 18d may be constituted of light receiving elements such as photodiodes arranged linearly. The line sensor 18d may receive the light transmitted through the light condensing lens 18c and may detect a light intensity distribution of the interference pattern. The line sensor 18d may receive a data output trigger from the wavelength control unit 21. The line sensor 18d may output data on the detected light intensity distribution of the interference pattern to the wavelength control unit 21 upon receipt of the data output trigger. Hereinafter, data on the detected light intensity distribution of the interference pattern may be referred to as interference pattern data. Note that a two-dimensional image sensor (not illustrated) in which light receiving elements (not illustrated) are arranged two-dimensionally may be used in place of the line sensor 18d.

As described in Patent Document 3, the square of a radius of an interference pattern detected by the line sensor 18d may have a proportional relation to the wavelength λ of the pulsed laser beam PL, which is derived from formula (1). The wavelength λ of the pulsed laser beam PL may be expressed by formula (2) below:

$$\lambda = \alpha r^2 \quad (2)$$

Here, r may be the radius of the interference pattern, and α may be a constant of proportionality. Based on formula (2), a spectral waveform that represents a relation between the light intensity and the wavelength may be calculated from the interference pattern detected by the line sensor 18d.

1.6 Second Etalon Spectrometer

The high reflection mirror 16d may be disposed in an optical path of the pulsed laser beam PL reflected by the abovementioned third beam splitter 16c. The pulsed laser beam PL reflected by the third beam splitter 16c may be reflected by the high reflection mirror 16d with high reflectance. The second etalon spectrometer 19 may be disposed in an optical path of the pulsed laser beam PL reflected by the high reflection mirror 16d.

The second etalon spectrometer 19 may include a diffusion plate 19a, an etalon 19b, a light condensing lens 19c, and a line sensor 19d. The diffusion plate 19a, the etalon 19b, the light condensing lens 19c, and the line sensor 19d may have the same configurations as the diffusion plate 18a, the etalon 18b, the light condensing lens 18c, and the line sensor 18d, included in the first etalon spectrometer 18, respectively. The second etalon spectrometer 19 may be used for measuring the spectral linewidth of the pulsed laser beam PL.

The pulsed laser beam PL that has entered the diffusion plate 19a may be transmitted therethrough as scattering light. The scattering light that has been transmitted through the diffusion plate 19a may enter the etalon 19b. The light that has a wavelength λ and has entered the etalon 19b can be transmitted through the etalon 19b at high transmittance when the incident angle θ of the light satisfies formula (1) above, where d may be a distance of an air gap between two partial reflection mirrors included in the etalon 19b, and n may be a refractive index in the air gap.

The light transmitted through the etalon 19b may enter the light condensing lens 19c. The light transmitted through the light condensing lens 19c may enter the line sensor 19d that is disposed at a distance corresponding to the focal length from the light condensing lens 19c. The light transmitted through the light condensing lens 19c can form an interference pattern on the line sensor 19d.

The line sensor 19d may be constituted of light receiving elements such as photodiodes arranged linearly. The line sensor 19d may receive the light transmitted through the light condensing lens 19c and may detect a light intensity distribution of the interference pattern. The line sensor 19d may receive a data output trigger from the spectral linewidth calculator 22. Upon receipt of the data output trigger, the line sensor 19d may output the interference pattern data to the spectral linewidth calculator 22. Note that a two-dimensional image sensor (not illustrated) in which light receiving elements are arranged two-dimensionally may be used as an alternative to the line sensor 19d.

The second etalon spectrometer 19 may have a higher resolving power than that of the first etalon spectrometer 18. As particular specification of the etalons, providing that free spectral ranges of the first etalon spectrometer 18 and the second etalon spectrometer 19 are denoted by FSR1 and FSR2, respectively, the free spectral range FSR1 of the first etalon spectrometer 18 is preferably wider than the free spectral range FSR2 of the second etalon spectrometer 19. More preferably, the value of FSR1/FSR2 may be within a range of 5 to 7 inclusive. Furthermore, the focal length of the light condensing lens 19c may be longer than the focal length of the light condensing lens 16c.

Moreover, the number of light receiving elements of the line sensor 19d may be greater than the number of light receiving elements of the line sensor 18d. The size and arrangement interval of the light receiving elements in the line sensor 19d may be equal to or smaller than the size and arrangement interval of the light receiving elements in the line sensor 18d, respectively.

As the resolving power of the second etalon spectrometer 19 is higher than the resolving power of the first etalon spectrometer 18, the resolution of the interference pattern detected by the line sensor 19d can be higher than the resolution of the interference pattern detected by the line sensor 18d. Using the interference pattern data detected by the line sensor 19d can make it possible to more precisely calculate the spectral linewidth of the pulsed laser beam PL.

The first etalon spectrometer 18 and the second etalon spectrometer 19 may have respective device functions that represent specific characteristics to the individual devices. The spectral waveforms of the pulsed laser beam PL incident on the etalon spectrometers 18 and 19 can be convolved with the respective device functions. Accordingly, each of the line sensors 18d and 19d can detect a light intensity distribution of such an interference pattern that corresponds to a spectral waveform of which the spectral linewidth is widened through the convolution of the device function.

For example, the device function of the second etalon spectrometer 19 may be denoted by I(λ) and a spectral waveform of the pulsed laser beam PL incident on the second etalon spectrometer 19 may be denoted by T(λ). Here, as shown in formula (3) below, the line sensor 19d can detect a light intensity distribution of an interference pattern corresponding to a spectral waveform. T'(λ) that is represented by a convolution integral of the spectral waveform T(λ) and the device function I(λ).

$$T'(\lambda) = T(\lambda) * I(\lambda) \qquad (3)$$

$$= \int_{-\infty}^{+\infty} T(x)I(\lambda - x)dx$$

Hereinafter, the spectral waveform T(λ) may be referred to as a first spectral waveform T(λ), and the spectral waveform T' (A) may be referred to as a second spectral waveform T'(λ).

Generally, if the etalon spectrometers are highly accurate, the first spectral waveform and the second spectral waveform can be substantially equal. However, highly-accurate etalon spectrometers are so large and expensive that it is not practical to serve the highly-accurate etalon spectrometers as the etalon spectrometers 18 and 19. Therefore, the second spectral waveform can practically have a wider spectral linewidth than the first spectral waveform.

Because the second etalon spectrometer 19 is used for measuring the spectral linewidth while the first etalon spectrometer 18 is used for measuring the center wavelength, the full width at half maximum of the second etalon spectrometer 19 may be smaller than the full width at half maximum of the first etalon spectrometer 18.

1.7 Exposure Apparatus

Referring again to FIG. 1, the exposure apparatus 4 may include an exposure apparatus control unit 40. The exposure apparatus control unit 40 may control the exposure apparatus 4, including the control of movement of a wafer stage (not illustrated). The exposure apparatus control unit 40 may output data on a target spectral linewidth $W_T$, data on a target center wavelength $\lambda_T$, data on target pulse energy, and an oscillation trigger signal to the laser control unit 20. The data on the target center wavelength $\lambda_T$ may be input to the laser control unit 20 in synchronism with the oscillation trigger signal, that is, for each pulse P.

1.8 Laser Control Unit

The laser control unit 20 may transmit the data on the target center wavelength $\lambda_T$, which is received from the exposure apparatus control unit 40, to the wavelength control unit 21. The laser control unit 20 may refer to the data on the target pulse energy, which is received from the exposure apparatus control unit 40, and the data on the pulse energy, which is received from the energy sensor 17, thereby controlling a setting value of the charging voltage of the power supply 12. By controlling the setting value of the charging voltage of the power supply 12, the laser control unit 20 may control the pulse energy of each pulse P of the pulsed laser beam PL.

The laser control unit 20 may output the oscillation trigger signal to the switch 12a included in the power supply 12, on the basis of the oscillation trigger signal received from the exposure apparatus control unit 40.

The laser control unit 20 may also measure an oscillation interval on the basis of the oscillation trigger signal received from the exposure apparatus control unit 40, using a timer (not illustrated). The oscillation interval may be a time period from the time at which one oscillation trigger signal is received to the time at which the next oscillation trigger signal is received. When the oscillation interval measured by the timer goes down to a predetermined value or less, the laser control unit 20 may determine that the pulsed laser beam. PL starts burst oscillation, which will be described later. In addition, when the oscillation interval measured by the timer goes above the predetermined value, the laser control unit 20 may determine that the burst oscillation is in an intermission.

1.9 Wavelength Control Unit

The wavelength control unit 21 may output the above-mentioned data output trigger to the line sensor 18d included in the first etalon spectrometer 18 when the wavelength control unit 21 receives the detection signal from the energy sensor 17. In other words, the first etalon spectrometer 18 may output the interference pattern data to the wavelength control unit 21 every time the first etalon spectrometer 18 receives one pulse P of the pulsed laser beam PL.

The wavelength control unit 21 may include a center wavelength calculator 21a. The center wavelength calculator 21a may receive the interference pattern data from the first etalon spectrometer 18 to calculate a center wavelength $\lambda_C$ by calculating a radius of the interference pattern in the free spectral range FSR1 of the first etalon spectrometer 18. Thus, the first etalon spectrometer 18 and the center wavelength calculator 21a may constitute a "center wavelength measuring unit" for measuring the center wavelength $\lambda_C$ of each pulse P of the pulsed laser beam PL.

Hereinafter, the center wavelength $\lambda_C$ calculated by the center wavelength calculator 21a may be referred to as the measured center wavelength $\lambda_C$. Note that the center wavelength calculator 21a may not be limited to be provided in the wavelength control unit 21 but may be provided in another component such as the laser control unit 20.

The wavelength control unit 21 may calculate a difference Δλ between the measured center wavelength $\lambda_C$ and the target center wavelength $\lambda_T$ that has been fed from the laser control unit 20. On the basis of the difference Δλ, the wavelength control unit 21 may control the rotary stage 14d which holds the prism 14d, so as the measured center wavelength $\lambda_C$ to be close to the target center wavelength $\lambda_T$. The control of the rotary stage 14d may be performed by sending a control signal from the wavelength control unit 21 to the first driver 23 which is connected to the rotary stage 14d.

1.10 Definition of Center Wavelength

Figure 3A:
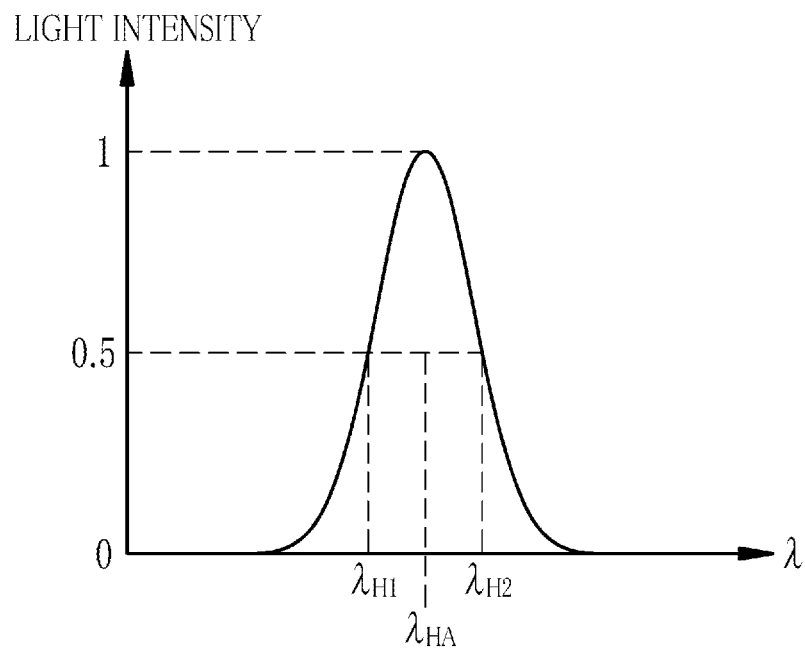
FIG. 3A is a diagram for explaining an example of the definition of the center wavelength.

FIG. 3A is a diagram for explaining an example of the definition of the center wavelength. FIG. 3A shows a spectral waveform of the pulsed laser beam PL. $\lambda_{HA}$ shown in FIG. 3A represents the mean value of two half-power wavelengths $\lambda_{H1}$ and $\lambda_{H2}$ of the spectral waveform. The half-power wavelengths $\lambda_{H1}$ and $\lambda_{H2}$ are the wavelengths at which a half of the light intensity peak value can be obtained.

In the present disclosure, the mean value $\lambda_{HA}$ of half-power wavelengths is defined to be the center wavelength. In the present disclosure, however, the center wavelength is not limited to the mean value of half-power wavelengths. The center wavelength may be any index that represents a wavelength located at the center of the spectral waveform, and may be a peak wavelength, a centroidal wavelength, or the like instead of the mean value of half-power wavelengths. The peak wavelength is a wavelength at which the light intensity reaches the maximum. The centroidal wavelength is a wavelength at the centroidal position of the light intensity distribution.

FIG. 3A is a conceptual diagram for explaining the definition of the center wavelength. In practice, the center wavelength calculator 21a may calculate the center wavelength from the interference pattern data without converting the interference pattern data to a spectral waveform that represents the light intensity and the wavelength. FIG. 33 shows an example of the interference pattern data. From the interference pattern data, the center wavelength calculator 21a may calculate a radius $r_1$ to an internal position and a radius $r_2$ to an external position of the interference pattern, at which positions a half value of the peak light intensity is obtained, and may calculate a radius $r_m$ of the interference pattern on the basis of a relation expressed by formula (4) below:

$$r_m^2 = \frac{r_1^2 + r_2^2}{2} \tag{4}$$

The radius $r_m$ of the interference pattern may correspond to the abovementioned mean value $\lambda_{HA}$ of the half-power wavelengths, as an example of the center wavelength. The center wavelength calculator 21a may calculate the measured center wavelength $\lambda_C$ by converting the radius $r_m$ to a wavelength on the basis of formula (2).

1.11 Spectral Linewidth Calculator

Figure 4:
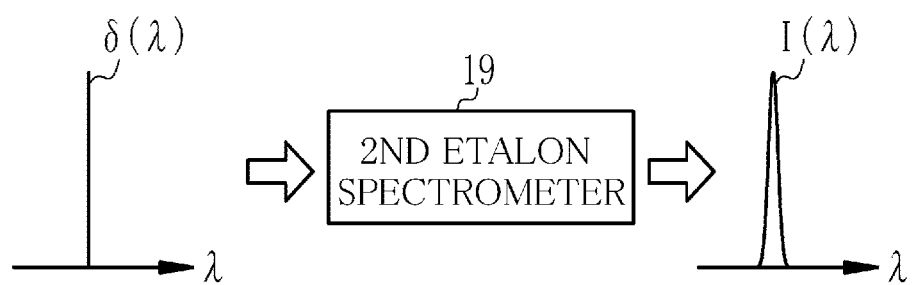
FIG. 4 is a diagram for explaining a device function $I(\lambda)$

The spectral linewidth calculator 22 may include a device function storage 22a, a counter 22b, and an arithmetic processing unit 22c. The device function storage 22a stores the device function $I(\lambda)$ of the second etalon spectrometer 19. As shown in FIG. 4, the device function $I(\lambda)$ may be a function of a spectral waveform that would be measured if light that is assumed to have a spectral waveform represented by a delta function $\delta(\lambda)$ is incident on the second etalon spectrometer 19.

In practice, there is no light source that can emit light with the delta function $\delta(\lambda)$. However, with a light source that has a sufficiently narrow spectral linewidth relative to the laser light, it may be possible to measure the device function $I(\lambda)$. As such a light source, a coherent light source may be used. For example, in a case where spectral waveforms having spectral linewidths of 300 fm or less is to be measured, coherent light having a spectral linewidth of 10 fm or less may be used. As a concrete example of the coherent light, the second harmonic light of laser light output from an Ar-ion laser oscillating in single longitudinal mode may be used in the case of a narrowband KrF excimer laser. In the case of a narrowband ArF laser, the fourth harmonic light of laser light output from a titanium sapphire laser oscillating in single longitudinal mode may be used. When it is difficult to measure the device function $I(\lambda)$, a theoretical device function $I(\lambda)$ may be estimated on the basis of design specification values of the second etalon spectrometer 19, and the estimated device function may be stored in the device function storage 22a.

The counter 22b may receive the detection signal from the energy sensor 17 to count the number of times the counter 22b has received the detection signal. Every time the count N of the detection signal reaches a multiple of a first number N1, the counter 22b may output the abovementioned data output trigger to the line sensor 19d included in the second etalon spectrometer 19. That is, the line sensor 19d is multiply exposed to the interference patterns the first number N1 of times, so that data on the multiple interference patterns can be integrated. Hereinafter, integrated data on the interference patterns may be referred to as integrated interference pattern data. The second etalon spectrometer 19 may output the integrated interference pattern data to the arithmetic processing unit 22c of the spectral linewidth calculator 22 every time the second etalon spectrometer 19 has received the pulses P of the pulsed laser beam PL the first number N1 of times.

For example, providing that data on an interference pattern accumulated and obtained by the line sensor 19d at each exposure to the interference pattern is denoted by $F_i(r)$ the integrated interference pattern data $SF_j(r)$ may be expressed by formula (5) below:

$$SF_j(r) = \sum_{i=1}^{N1} F_i(r) \tag{5}$$

Figure 5:
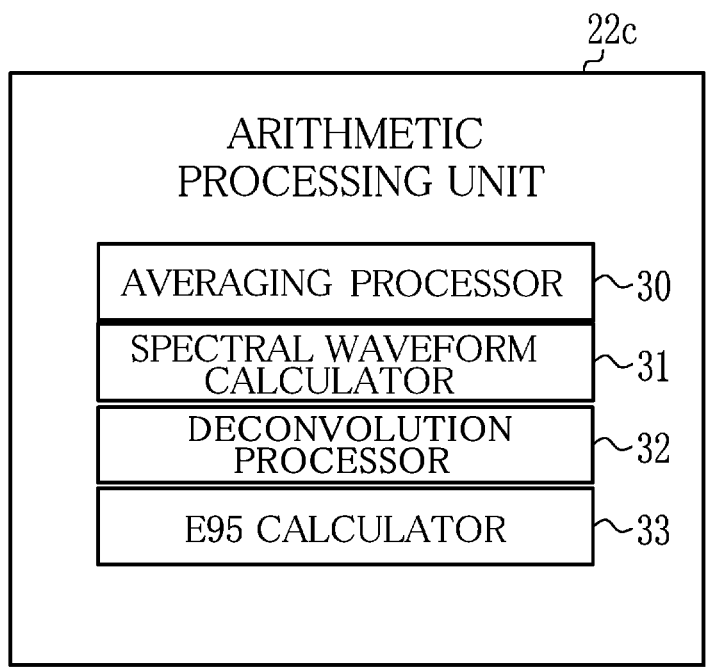
FIG. 5 is a diagram illustrating a configuration of an arithmetic processing unit 22c.

In FIG. 5, the arithmetic processing unit 22c may include an averaging processor 30, a spectral waveform calculator 31, a deconvolution processor 32, and an E95 calculator 33. Every time the integrated interference pattern data $SF_j(r)$ from the line sensor 19d has been input to the averaging processor 30 a second number N2 of times, the averaging processor 30 may average the input N2 pieces of integrated interference pattern data $SF_j(r)$. Data AF(r) on the average of the integrated interferfence patterns, which is obtained by the averaging processor 30, may be expressed by formula (6) below:

$$AF(r) = \frac{1}{N2} \sum_{j=1}^{N2} SF_j(r) \tag{6}$$

Hereinafter, the data AF(r) on the average of the integrated interference patterns, which is obtained by the averaging processor 30, may be referred to as integration average data AF(r).

Figure 3B:
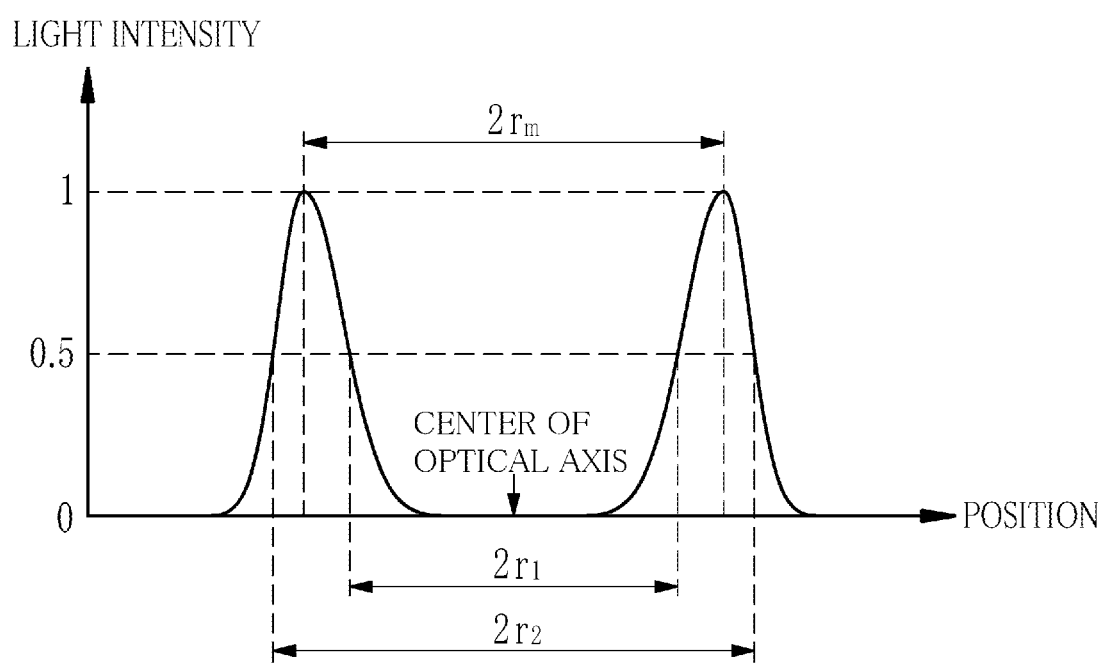
FIG. 3B is a diagram illustrating an example of interference pattern data

The spectral waveform calculator 31 can provide a spectral waveform $O(\lambda)$ by extracting an interference pattern which, for example, corresponds to such a spectral waveform of the pulsed laser beam PI, as shown in FIG. 3B, from the integration average data AF(r) provided by the averaging processor 30, and making a calculation based on formula (2). Hereinafter, the spectral waveform $O(\lambda)$ provided by the spectral waveform calculator 31 may be referred to as the observed spectral waveform $O(\lambda)$.

Thus, integrating the interference pattern data $F_i(r)$ and averaging the integrated value can provide the observed spectral waveform $O(\lambda)$ from which noise components are reduced. The observed spectral waveform O(A) can correspond to the aforementioned second spectral waveform T'($\lambda$) which is convolved with the device function $I(\lambda)$ through the second etalon spectrometer 19.

The deconvolution processor 32 may perform deconvolution processing on the observed spectral waveform O(A) with the device function $I(\lambda)$ stored in the device function storage 22a. For example, the deconvolution processor 32 may perform the deconvolution processing for obtaining a spectral waveform $Q(\lambda)$ that satisfies formula (7) below:

$$O(\lambda) = Q(\lambda) * I(\lambda) \tag{7}$$
$$= \int_{-\infty}^{+\infty} Q(x) I(\lambda - x) dx$$

Hereinafter, the spectral waveform $Q(\lambda)$ obtained by the deconvolution processor 32 may be referred to as the restored spectral waveform $Q(\lambda)$ An iterative method such as Jacobi's method and Gauss-Seidel method may be applied to the deconvolution processing. The restored spectral waveform Q(λ) obtained by the deconvolution processor 32 can correspond to the first spectral waveform T(λ) provided before the convolution of the device function I(λ) through the second etalon spectrometer 19.

Accordingly, every time the count N of the counter 22b reaches a third number N3 that is a product of the first number N1 and the second number N2, the deconvolution processor 32 can provide the restored spectral waveform Q(λ)

The first number N1 and the second number N2 may be stored in a memory (not illustrated) which is included in the laser control unit 20. The first number N1 and the second number N2 may be read from the memory of the laser control unit 20 and set in the counter 22b. For example, the first number N1 may be eight (N1=8), and the second number N2 may be five (N2=5). Alternatively, the first number N1 may be five (N1=5), and the second number N2 may be eight (N2=8).

From the restored spectral waveform Q(λ) provided by the deconvolution processor 32, the E95 calculator 33 may calculate a value of spectral purity E95, which will be described later, as a spectral linewidth $W_D$. The E95 calculator 33 may output data on the calculated spectral linewidth $W_D$ to the laser control unit 20. Hereinafter, the spectral linewidth $W_D$ calculated by the E95 calculator 33 may be referred to as the measured spectral linewidth $W_D$.

As described above, the second etalon spectrometer 19 and the spectral linewidth calculator 22 can constitute a "spectral linewidth measuring apparatus" for measuring the spectral linewidth $W_D$ of the pulsed laser beam. PL.

1.12 Definition of Spectral Linewidth

Figure 6:
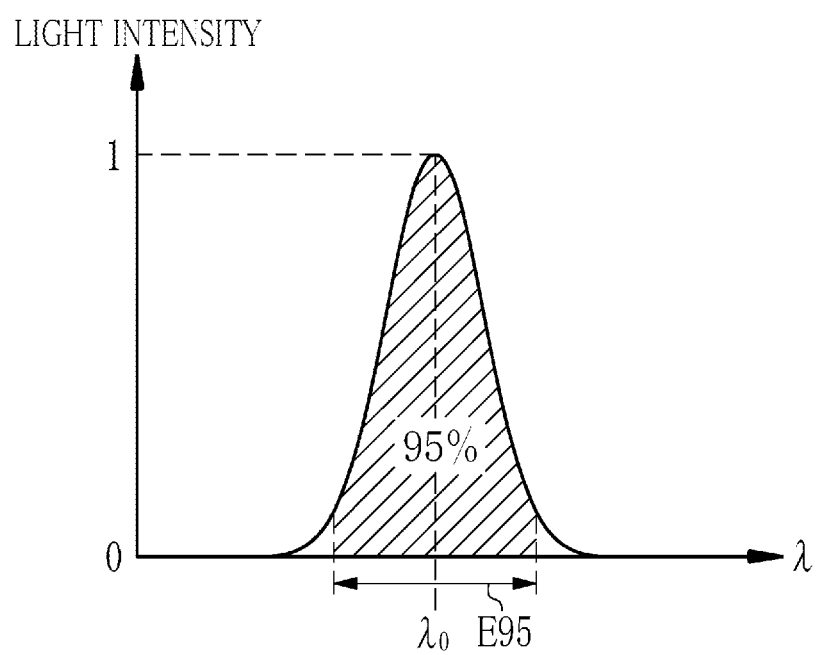
FIG. 6 is a diagram for explaining an example of the definition of the spectral linewidth.

FIG. 6 is a diagram for explaining an example of the definition of the spectral linewidth. FIG. 6 shows a spectral waveform of the pulsed laser beam PL. As shown in FIG. 6, the full width of a fragment, which is centered at the peak wavelength $\lambda_0$ and takes up 95% of the total energy of the spectral waveform, is called the spectral purity E95. The spectral purity E95 corresponds to Δλ that satisfies formula (8) below:

$$\frac{\int_{-\Delta\lambda/2}^{\Delta\lambda/2} Q(\lambda)d\lambda}{\int_{-\infty}^{\infty} Q(\lambda)d\lambda} = 0.95 \qquad (8)$$

In the present disclosure, a calculated value of the spectral purity E95, which is obtained according to formula (8) above, is the measured spectral linewidth $W_D$. Note that the measured spectral linewidth $W_D$ in the present disclosure is not limited to the spectral purity E95. The measured spectral linewidth $W_D$ may be an index that represents the linewidth of the spectral waveform, and may be such as the full width at half maximum instead of the spectral purity.

1.13 Spectral Linewidth Control Unit

Referring again to FIG. 1, the laser control unit 20 may include a spectral linewidth control unit 20a. The spectral linewidth control unit 20a may be configured as a program module loaded in a memory (not illustrated) which is included in the laser control unit 20.

The spectral linewidth control unit 20a may calculate a difference ΔW between the measured spectral linewidth $W_D$, which is received from the E95 calculator 33 of the spectral linewidth calculator 22, and the target spectral linewidth $W_T$, which is received from the exposure apparatus control unit 40. The spectral linewidth control unit 20a may control the spectral linewidth modifier 15 through the second driver 24 on the basis of the difference ΔW so as to bring the measured spectral linewidth $W_D$ close to the target spectral linewidth $W_T$. Thereby, the spectral linewidth of the pulsed laser beam. PL output from the narrowband laser apparatus may be made closer to the target spectral linewidth $W_T$. The target spectral linewidth $W_T$ may be in a range of 200 to 400 fm inclusive, and may preferably be 300 fm.

1.14 Output Pattern of Pulsed Laser Beam

Figure 7:
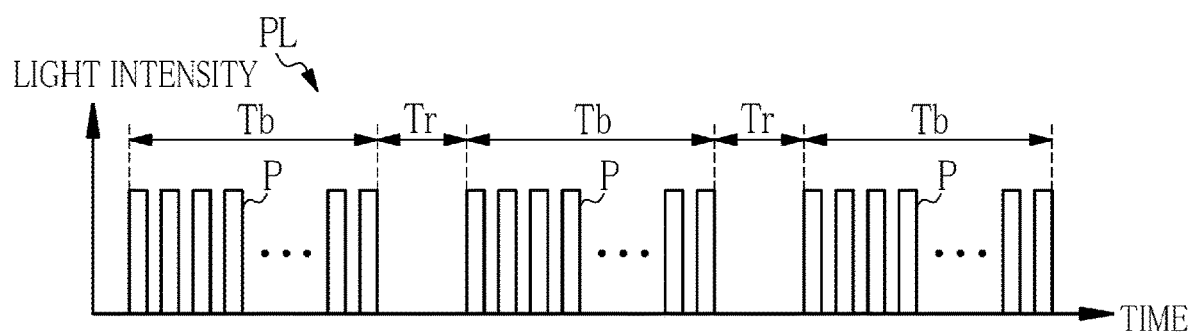
FIG. 7 is a diagram illustrating an example of an output pattern of a pulsed laser beam PL from the narrowband laser apparatus.

FIG. 7 is a diagram illustrating an example of an output pattern of the pulsed laser beam PL from the narrowband laser apparatus. The narrowband laser apparatus oscillates the pulsed laser beam PL in response to the oscillation trigger signal received from the exposure apparatus 4. The narrowband laser apparatus may repeat the burst oscillation with intermissions, outputting the pulses P of the pulsed laser beam PL at a repetition frequency of not less a predetermined threshold in the burst oscillation.

A burst oscillation period Tb may be a period during which the exposure apparatus 4 makes exposure for one exposure area on a semiconductor wafer. An intermission period Tr may be a period from the end of the exposure for one exposure area to the start of the next exposure for another exposure area. For example, the intermission period Tr may have a time duration in a range of 0.1 to 10 seconds inclusive. It may be possible to move the wafer stage (not illustrated) during the intermission period Tr.

In the burst oscillation period Tb, oscillation of the pulsed laser beam PL may be performed at a high pulse repetition frequency, for example, from 1 kHz to 6 kHz inclusive. The number of pulses P to be output from the narrowband laser apparatus in the burst oscillation period Tb may be in a range of 100 to 2000 inclusive.

1.15 Operation 1.15.1 Wavelength Control

Figure 8:
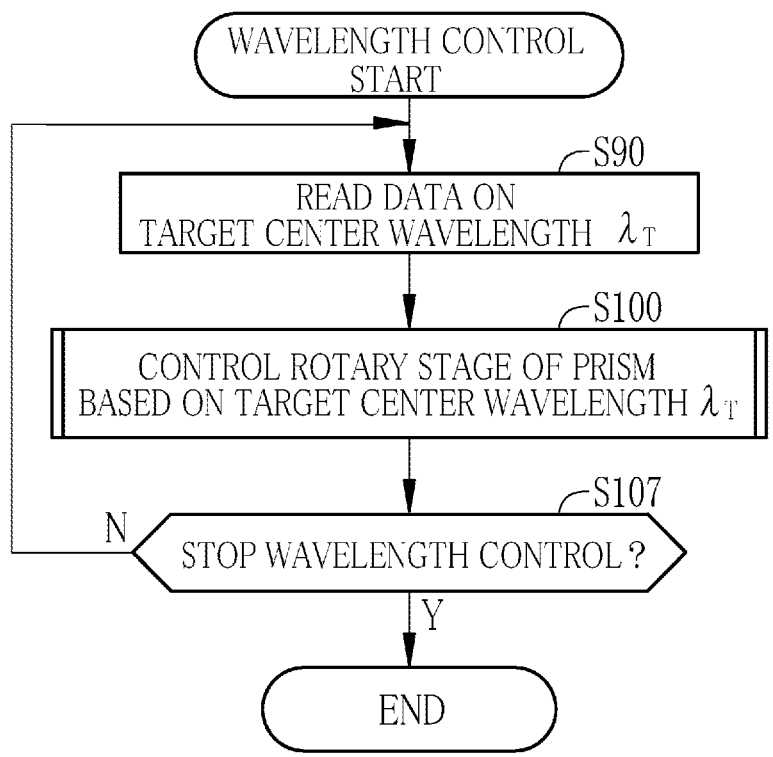
FIG. 8 is a flowchart illustrating a wavelength control process by a wavelength control unit 21 shown in FIG. 1.

FIG. 8 is a flowchart illustrating the wavelength control process by the wavelength control unit 21 shown in FIG. 1. The wavelength control unit 21 may control the wavelength of the oscillation by the narrowband laser apparatus on the basis of the target center wavelength $\lambda_T$ through the following process. As described later with reference to step S100 shown in FIG. 9, the wavelength control process shown in FIG. 8 may be performed for each pulse P of the pulsed laser beam PL in the burst oscillation period Tb.

The wavelength control unit 21 may perform the following process. First, in step S90, the wavelength control unit 21 may read the data on the target center wavelength $\lambda_T$ from the exposure apparatus control unit 40 through the laser control unit 20. Then, in step S100, the wavelength control unit 21 may control the rotary stage 14d holding the prism 14b on the basis of the target center wavelength $\lambda_T$, the detail of the process in step S100 will be described later with reference to FIG. 9.

Next, in step S107, the wavelength control unit 21 may determine whether to stop the wavelength control. For example, when it is necessary to prioritize some laser control other than the wavelength control, the wavelength control unit 21 may determine to stop the wavelength control. If not to stop the wavelength control (S107; NO), the wavelength control unit 21 may return to the abovementioned step S90. If to stop the wavelength control (S107; YES), the wavelength control unit 21 may terminate the process on the flowchart of FIG. 8.

Figure 9:
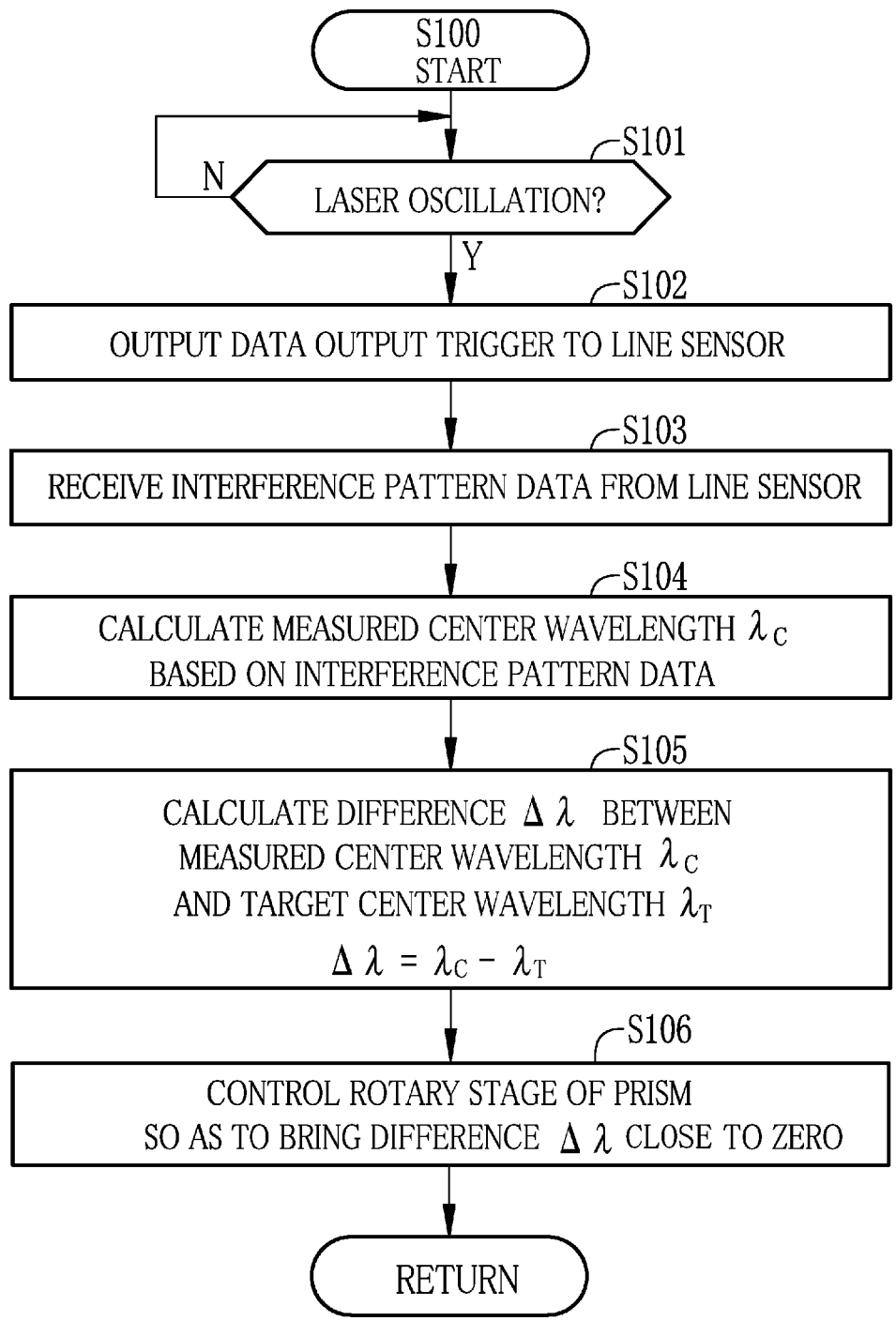
FIG. 9 is a flowchart illustrating the detail of a process for controlling a rotary stage 14d shown in FIG. 8.

FIG. 9 is a flowchart illustrating the detail of the process for controlling the rotary stage 14d shown in FIG. 8. The wavelength control unit 21 may perform the process shown in FIG. 9 as a subroutine of step 3100 shown in FIG. 8.

First, in step 3101, the wavelength control unit 21 may determine whether the narrowband laser apparatus has started the laser oscillation. For example, when the wavelength control unit 21 receives the detection signal from the energy sensor 17 once, the wavelength control unit 21 may determine that the narrowband laser apparatus has started the laser oscillation. While the narrowband laser apparatus is not performing the laser oscillation (S101; NO), the wavelength control unit 21 may stand by until the narrowband laser apparatus starts the laser oscillation. The wavelength control unit 21 may proceed to step S102 when the narrowband laser apparatus starts the laser oscillation (S101; YES).

In step S102, the wavelength control unit 21 may output the data output trigger to the line sensor 18*d* included in the first etalon spectrometer 18. Next, in step 3103, the wavelength control unit 21 may receive the interference pattern data that is output from the line sensor 18*d* upon the data output trigger being input to the line sensor 18*d*.

Then, in step S104, the center wavelength calculator 21*a* included in the wavelength control unit 21 may calculate the measured center wavelength $\lambda_C$ of each pulse P on the basis of the interference pattern data received from the line sensor 18*d*.

Then, in step S105, the wavelength control unit 21 may calculate the difference $\Delta\lambda$ between the measured center wavelength $\lambda_C$, which is calculated by the center wavelength calculator 21*a*, and the target center wavelength $\lambda_T$, according to formula (9) below:

$$\Delta\lambda = \lambda_C - \lambda_T \quad (9)$$

Thereafter, in step S106, the wavelength control unit 21 may control the rotary stage 14*d* which holds the prism 14*d*, so as to make the difference $\Delta\lambda$ between the measured center wavelength $\lambda_C$ and the target center wavelength $\lambda_T$ close to zero.

Through the process above, the wavelength control unit 21 may perform the control to bring the measured center wavelength $\lambda_C$ close to the target center wavelength $\lambda_T$.

1.15.2 Spectral Linewidth Control

Figure 10:
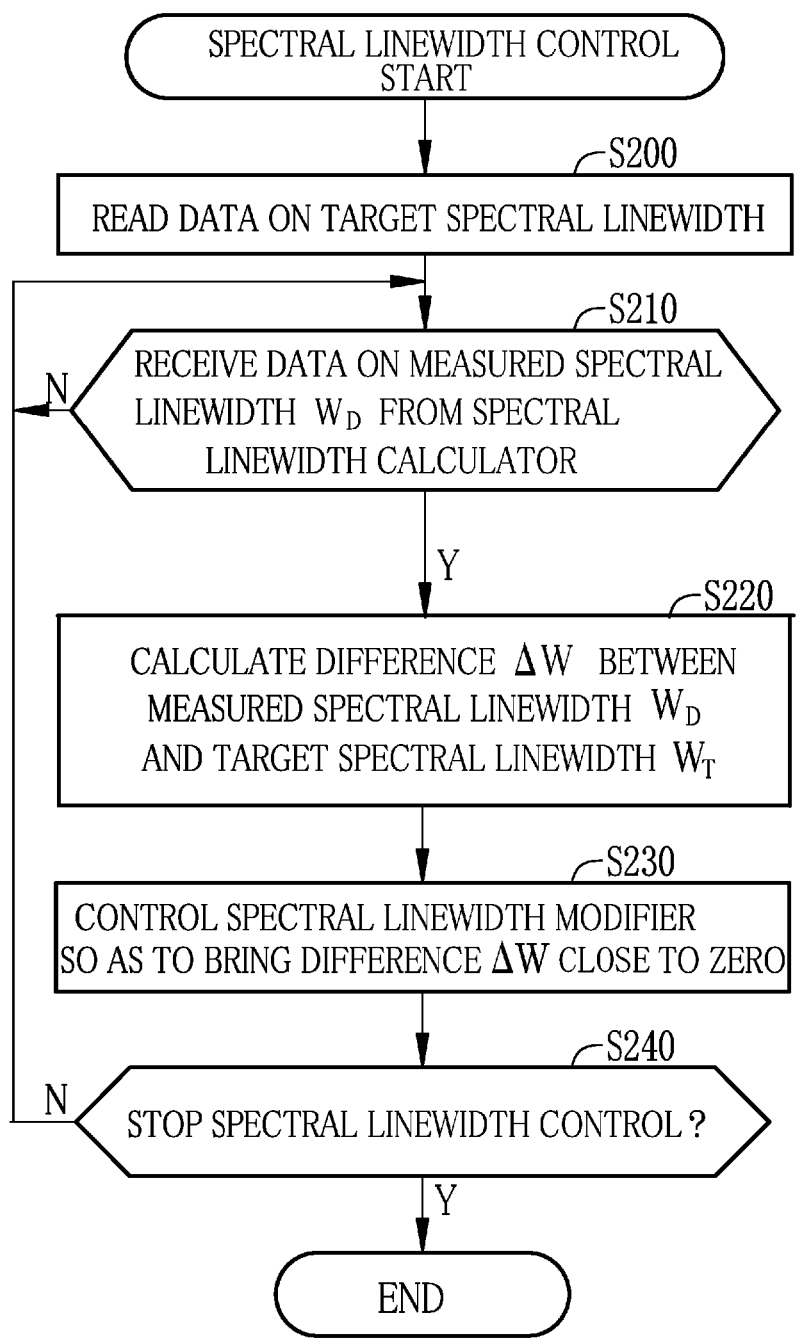
FIG. 10 is a flowchart illustrating a spectral linewidth control process by a spectral linewidth control unit 20a shown in FIG. 1.

FIG. 10 is a flowchart illustrating the spectral linewidth control process by the spectral linewidth control unit 20*a* shown in FIG. 1. Through the following process, the spectral linewidth control unit 20*a* may control the spectral linewidth of the pulsed laser beam PL generated by the narrowband laser apparatus.

First, in step S200, the spectral linewidth control unit 20*a* may read the data on the target spectral linewidth $W_T$ which has been fed from the exposure apparatus control unit 40 to the laser control unit 20. Next, in step S210, the spectral linewidth control unit 20*a* may determine whether the data on the measured spectral linewidth $W_D$ is received from the spectral linewidth calculator 22. When the data on the measured spectral linewidth. $W_D$ is not received (S210; NO), the spectral linewidth control unit 20*a* may stand by until the spectral linewidth control unit 20*a* receives the data on the measured spectral linewidth $W_D$. When the spectral linewidth control unit 20*a* receives the data on the measured spectral linewidth $W_D$ (S210; YES), the spectral linewidth control unit 20*a* may proceed to step S220.

In step S220, the spectral linewidth control unit 20*a* may calculate the difference $\Delta W$ between the measured spectral linewidth $W_D$ and the target spectral linewidth $W_T$ according to formula (10) below:

$$\Delta W = W_D - W_T \quad (10)$$

Next, in step S230, the spectral linewidth control unit 20*a* may control the spectral linewidth modifier 15 through the second driver 24 so as to bring the difference $\lambda W$ between the measured spectral linewidth $W_D$ and the target spectral linewidth $W_T$ close to zero.

Thereafter, in step S240, the spectral linewidth control unit 20*a* may determine whether to stop the spectral linewidth control. For example, when it is necessary to prioritize some laser control other than the spectral linewidth control, the spectral linewidth control unit 20*a* may determine to stop the spectral linewidth control. If not to stop the spectral linewidth control (S240; NO), the spectral linewidth control unit 20*a* may return to the abovementioned step S210. If to stop the spectral linewidth control (S240; YES), the spectral linewidth control unit 20*a* may terminate the process on the flowchart of FIG. 10.

1.15.3 Spectral Linewidth Calculation

Figure 11:
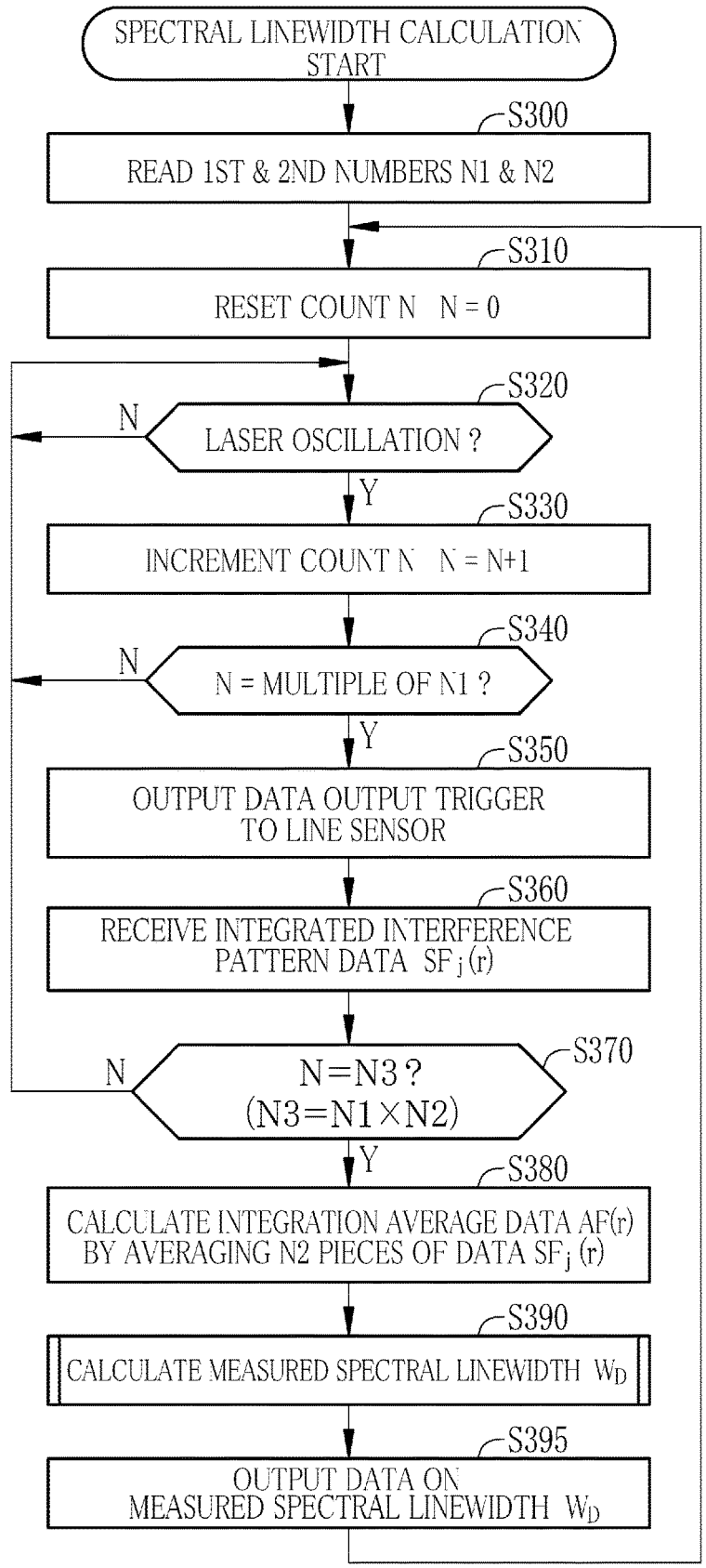
FIG. 11 is a flowchart illustrating a spectral linewidth calculation process by a spectral linewidth calculator 22 shown in FIG. 1.

FIG. 11 is a flowchart illustrating the spectral linewidth calculation process by the spectral linewidth calculator 22 shown in FIG. 1. Through the following process, the spectral linewidth calculator 22 may calculate the spectral linewidth of the pulsed laser beam PL generated by the narrowband laser apparatus.

First, in step S300, the spectral linewidth calculator 22 may read data on the first number N1 and the second number N2 from the memory of the laser control unit 20. The following process may be performed during the burst oscillation of the pulsed laser beam PL.

In step S310, the counter 22*b* included in the spectral linewidth calculator 22 may reset the count N to be "N=0". Next, in step S320, the counter 22*b* may determine whether the narrowband laser apparatus has started the laser oscillation. For example, upon receipt of one detection signal from the energy sensor 17, the counter 22*b* may determine that the narrowband laser apparatus has started the laser oscillation. While the narrowband laser apparatus is not performing the laser oscillation (S320; NO), the counter 22*b* may stand by until the narrowband laser apparatus starts the laser oscillation. The counter 22*b* may proceed to step S330 when the narrowband laser apparatus starts the laser oscillation (S320; YES).

In step 330, the counter 22*b* may increment the count N. For example, the counter 22*b* may add "1" to the current count N. At that time, a part of the pulsed laser beam PL enters the second etalon spectrometer 19, so that the line sensor 19*d* is exposed through the etalon 19*b* to an interference pattern. Thus, in the line sensor 19*d*, the interference pattern data $F_i(r)$ may be integrated.

Next, in step S340, the spectral linewidth calculator 22 may determine whether the count N is a multiple of the first number N1. When the count N is not a multiple of the first number N1 (S340 NO), the spectral linewidth calculator 22 may return to the abovementioned step S320. When the count N reaches a multiple of the first number N1 (S340; YES) the spectral linewidth calculator 22 may proceed to step S350. When the process proceeds to step S350, the integrated interference pattern data $SF_j(r)$, which is provided by integrating N1 pieces of interference pattern data $F_1(r)$ to $F_{N1}(r)$, may be accumulated in the line sensor 19*d*, as expressed by formula (5) above.

In step S350, the spectral linewidth calculator 22 may output the data output trigger to the line sensor 19*d* of the second etalon spectrometer 19. Next, in step 360, the spectral linewidth calculator 22 may receive the integrated interference pattern data $SF_j(r)$ from the line sensor 19*d* which outputs the integrated interference pattern data $SF_j(r)$ upon the data output trigger being input to the line sensor 19d. The integrated interference pattern data $SF_j(r)$ received by the spectral linewidth calculator 22 is stored in the averaging processor 30 which is included in the arithmetic processing unit 22c.

Next, in S370, the spectral linewidth calculator 22 may determine whether the count N is the third number N3. The third number N3 may be a product of the first number N1 and the second number N2. When the count N is not the third number N3 (S370; NO), the spectral linewidth calculator 22 may return to the abovementioned step S320. When the count N reaches the third number N3 (S370; YES), the spectral linewidth calculator 22 may proceed to step S380. When the process proceeds to step S380, N2 pieces of integrated interference pattern data $SF_1(r)$ to $SF_{N2}(r)$, which have been fed from the line sensor 19d, may have been stored in the averaging processor 30.

Figure 12:
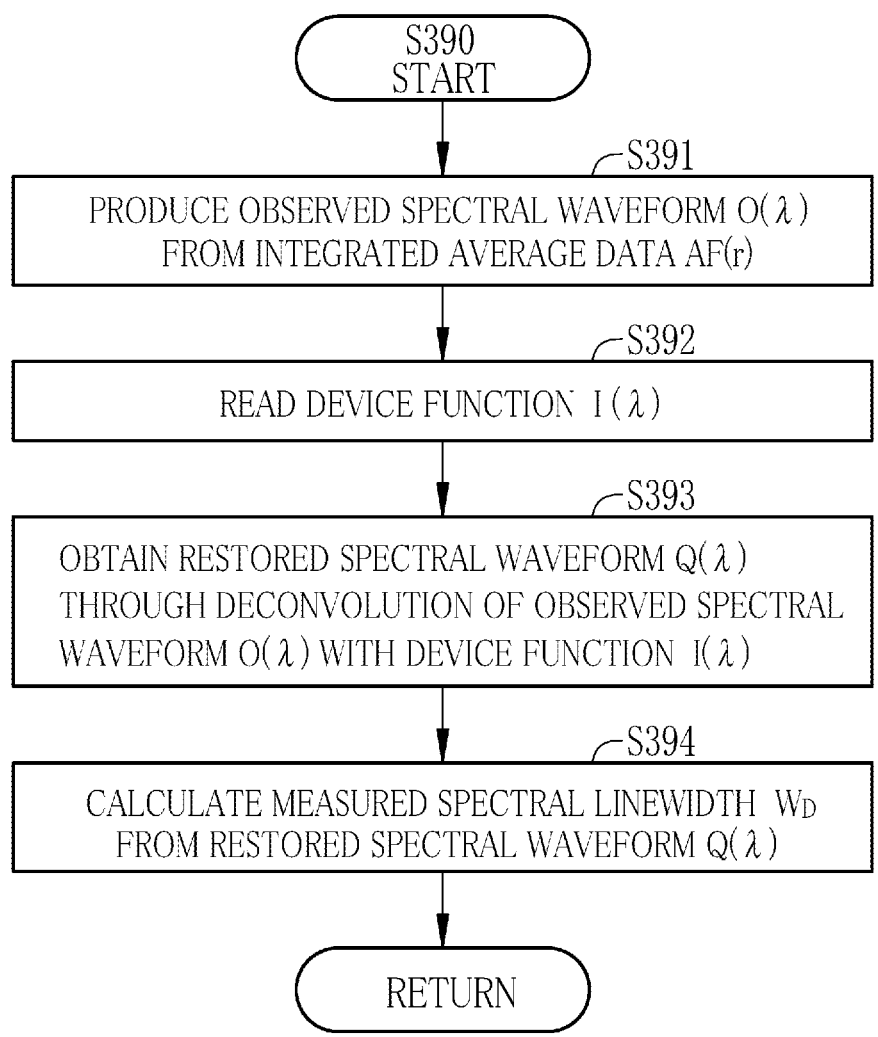
FIG. 12 is a flowchart illustrating a subroutine as a part of the flowchart shown in FIG. 11.

In step S380, the averaging processor 30 may average the N2 pieces of integrated interference pattern data $SF_1(r)$ to $SF_{N2}(r)$ according to formula (6) above, thereby to produce the integration average data AF(r). Next, in step 3390, a subroutine shown in FIG. 12 may be referred to. In step S391 shown in FIG. 12, the spectral waveform calculator 31, which is included in the arithmetic processing unit 22c, may produce the observed spectral waveform $O(\lambda)$ from the integration average data AF(r) produced by the averaging processor 30.

Then, in step S392, the deconvolution processor 32 may read the device function $I(\lambda)$ which is stored in the device function storage 22a. Next, in step S393, the deconvolution processor 32 may perform the deconvolution processing on the observed spectral waveform $O(\lambda)$ using the device function $I(\lambda)$, to obtain the restored spectral waveform $Q(\lambda)$ which satisfies formula (7) above.

Next, in step S394, the E95 calculator 33 may calculate the measured spectral linewidth $W_D$ from the restored spectral waveform $Q(\lambda)$. Then, returning to the flowchart shown in FIG. 11, in step S395, the spectral linewidth calculator 22 may output data on the measured spectral linewidth $W_D$, which is calculated by the E95 calculator 33, to the spectral linewidth control unit 20a. The data on measured spectral linewidth $W_D$ may be received by the spectral linewidth control unit 20a in step S210 of the abovementioned flowchart shown in FIG. 10.

Thereafter, the process may be returned to the abovementioned step S310. The spectral linewidth calculation process described above may be repeatedly performed during the burst oscillation period Tb.

2. Problem

Figure 13:
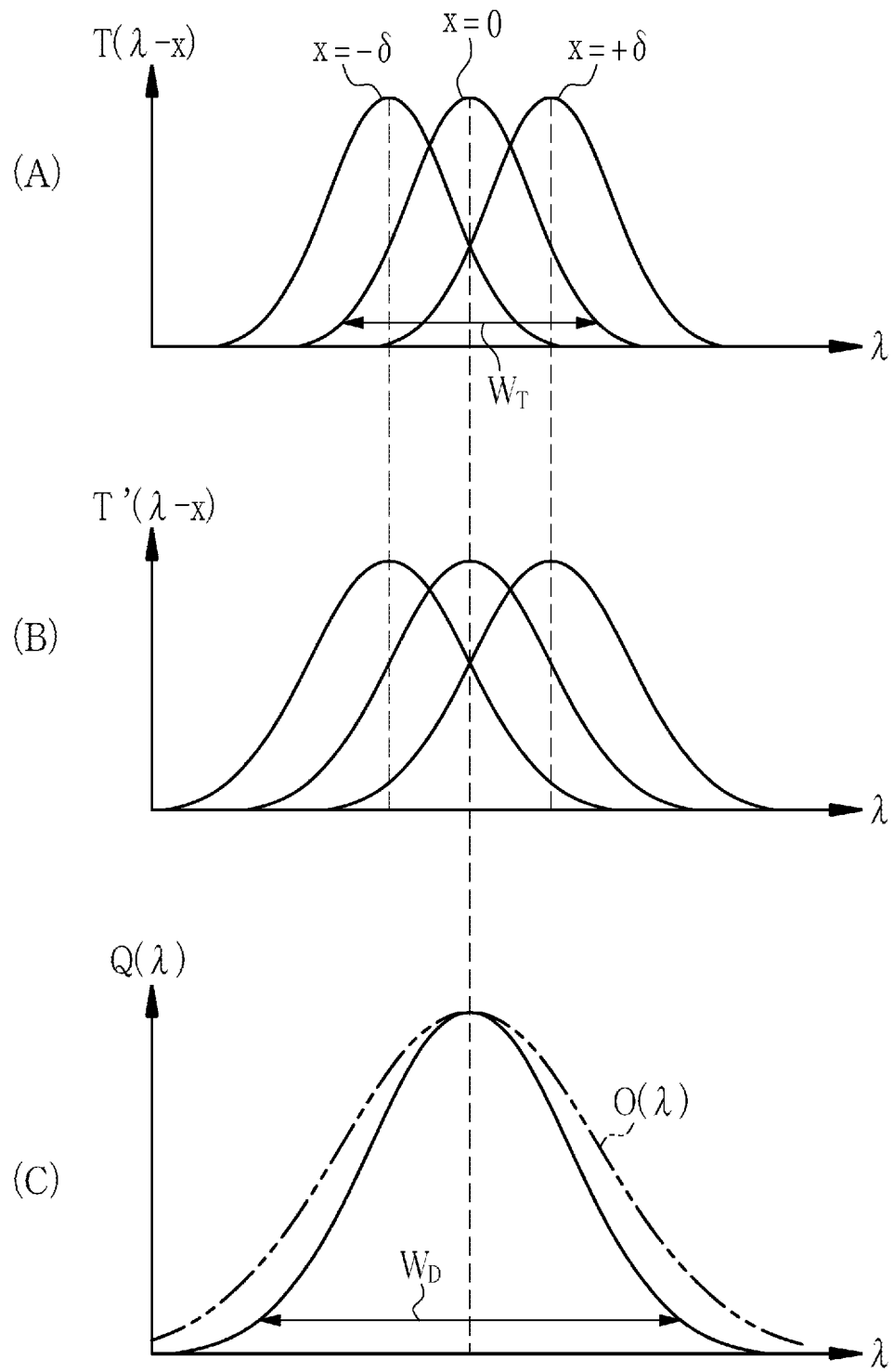
FIG. 13 shows diagrams for explaining the problem addressed in the present disclosure: (A) a diagram illustrating an example of first spectral waveforms $T(\lambda-x)$, (B) a diagram illustrating an example of second spectral waveforms $T'(\lambda-x)$ and (C) a diagram illustrating an example of an observed spectral waveform $O(\lambda)$ and a restored spectral waveform $Q(\lambda)$

FIG. 13 shows diagrams for explaining the problem addressed in the present disclosure. In the comparative example mentioned above, the spectral linewidth measuring apparatus, which is constituted of the second etalon spectrometer 19 and the spectral linewidth calculator 22, may calculate the measured spectral linewidth $W_D$ on the basis of the integration average data AF(r) which is provided by integrating and averaging the interference pattern data. $F_i(r)$. That is the spectral linewidth measuring apparatus may obtain the measured spectral linewidth $W_D$ on the basis of the multiple pulses P included in the pulsed laser beam PL.

However, the target center wavelength $\lambda_T$, which is fed from the exposure apparatus control unit 40 to the narrowband laser apparatus, may be changed for each pulse P during the burst oscillation period Tb. This may be, for example, for the purpose of correcting the focal position of a reducing projection lens included in the exposure apparatus 4.

Thus, when the target center wavelength $\lambda_T$ is changed, the center wavelength of the first spectral waveform of the pulsed laser beam. PL output from the narrowband laser apparatus may be changed for each pulse P, as shown in FIG. 13(A), because of the abovementioned control by the wavelength control unit 21.

FIG. 13(A) shows the first spectral waveforms $T(\lambda-x)$ provided that "x" represents a parameter indicating a change amount of the target center wavelength $\lambda_T$. For convenience sake, merely three variations of the spectral waveforms $T(\lambda-x)$ may be illustrated: one for "x=0" where the target center wavelength $\lambda_T$ is not changed, one for "x=+δ" where the target center wavelength $\Delta_T$ is changed by "+δ", and one for "x=−δ" where the target center wavelength $\lambda_T$ is changed by "−δ".

FIG. 13(B) shows the second spectral waveforms $T'(\lambda-x)$ which are provided after the pulsed laser beams PL with the first spectral waveforms $T(\lambda-x)$ have entered the second etalon spectrometer 19, respectively. The second spectral waveform $T'(\lambda-x)$ may be provided through the convolution of the first spectral waveform $T(\lambda-x)$ with the device function $I(\lambda)$. The spectral linewidth measuring apparatus may provide the observed spectral waveform $O(\lambda)$ by integrating and averaging a number of pieces of interference pattern data $F_i(r)$ produced from the plurality of pulses P having the second spectral waveforms $T'(\lambda-x)$.

FIG. 13(C) shows the observed spectral waveform $O(\lambda)$ provided by the spectral linewidth measuring apparatus and the restored spectral waveform $Q(\lambda)$ obtained through the deconvolution processing with the device function $I(\lambda)$. The spectral linewidth measuring apparatus may obtain the restored spectral waveform $Q(\lambda)$ on the basis of the pulses P having different center wavelengths. The restored spectral waveform $Q(\lambda)$ may correspond to a waveform provided by overlaying the first spectral waveforms $T(\lambda-x)$ having different center wavelengths.

Accordingly, in the comparative example, with the target center wavelength $\lambda_T$ being changed for each pulse P, the measured spectral linewidth $W_D$ calculated on the basis of the restored spectral waveform $Q(\lambda)$ can become wider than the actual spectral linewidth $W_T$ of the pulsed laser beam PL, shown in FIG. 13(A).

In order to solve the problem, in the embodiments described below, data on the center wavelength of each pulse P of the pulsed laser beam PL may be obtained to calculate the measured spectral linewidth $W_D$ taking account of the obtained data on the center wavelength and the device function $I(\lambda)$.

3. Narrowband Laser Apparatus Measuring Spectral Linewidth Taking Account of Center Wavelength of Each Pulse (First Embodiment)

3.1 Configuration

Figure 14:
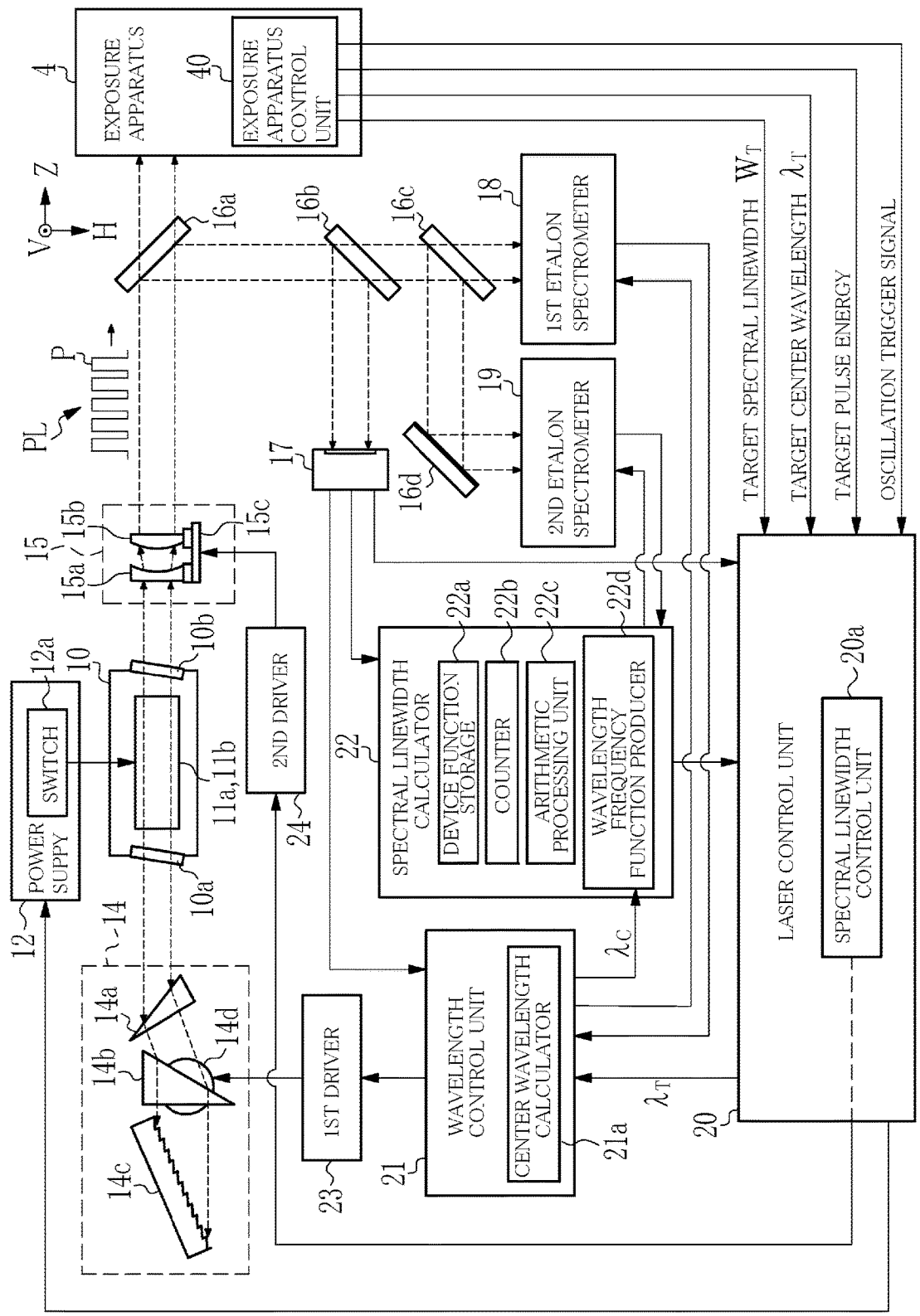
FIG. 14 is a diagram schematically illustrating a configuration of a narrowband laser apparatus according to a first embodiment of the present disclosure.

FIG. 14 schematically shows a configuration of a narrowband laser apparatus according to a first embodiment of the present disclosure. In the first embodiment, the narrowband laser apparatus may be provided with a wavelength frequency function generator 22d in a spectral linewidth calculator 22 in addition to the configuration of the comparative example described with reference to FIG. 1. Furthermore, the narrowband laser apparatus may be provided with a signal line for transmitting data on the measured center wavelength $\lambda_C$ of each pulse P from a wavelength control unit 21 to the wavelength frequency function generator 22d.

The wavelength control unit 21 may output the data on the measured center wavelength $\lambda_C$ to the wavelength frequency function generator 22d every time a center wavelength calculator 21a calculates the measured center wavelength $\lambda_C$. The wavelength frequency function generator 22d may receive the data on the measured center wavelength $\lambda_C$ for each pulse P from the wavelength control unit 21.

The wavelength frequency function generator 22d may divide the wavelength range into several sections and tally the frequency of appearance of the measured center wavelength $\lambda_C$ in each section, thereby to generate a wavelength frequency function $R(\lambda)$. The wavelength frequency function generator 22d may generate the wavelength frequency function $R(\lambda)$ from the third number N3 of pieces of data on the measured center wavelength $\lambda_C$ every time the count N of a counter 22b reaches the third number N3.

For example, if the actual measured center wavelength $\lambda_C$ is controlled to be approximately equal to the target center wavelength $\lambda_T$, the wavelength frequency function $R(\lambda)$ can correspond to the frequency distribution of the target center wavelength $\lambda_T$ which is fed from an exposure apparatus control unit 40 to the narrowband laser apparatus while the target center wavelength $\lambda_T$ being changed for each pulse P.

Figure 15:
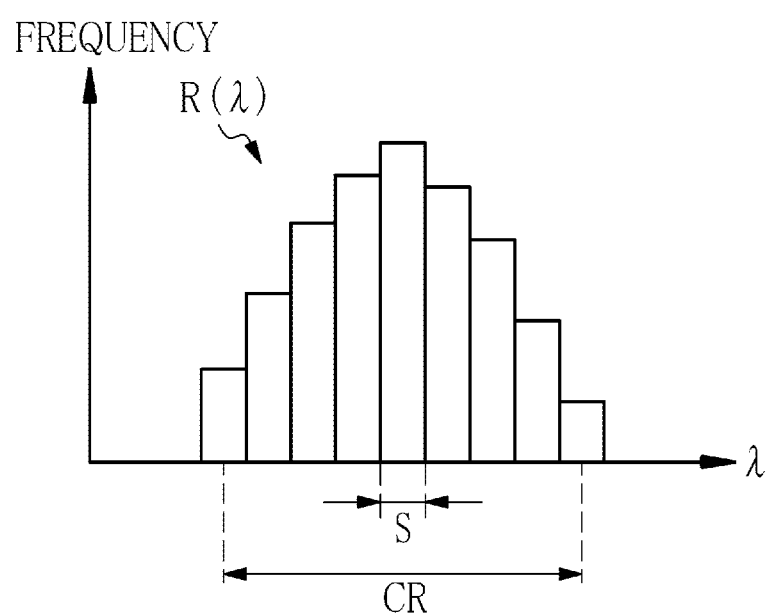
FIG. 15 is a diagram illustrating an example of a wavelength frequency function $R(\lambda)$ generated by a wavelength frequency function generator 22d.

FIG. 15 shows an example of the wavelength frequency function $R(\lambda)$ generated by the wavelength frequency function generator 22d. One section shown in FIG. 15 may have a width S that is an integer multiple of a quantization unit $\Delta$ which is attributable to a line sensor 19d of a second etalon spectrometer 19. The device function $I(\lambda)$ and the observed spectral waveform $O(\lambda)$, mentioned above, may be composed of discrete data based on the resolving power of the line sensor 19d. The minimum wavelength interval of the discrete data may be the quantization unit $\Delta$.

The width S of one section may be in a range satisfying a condition "0<S≤7 fm", and may preferably be in a range satisfying a condition "5 fm<S≤6 fm".

FIG. 15 also shows a wavelength change amount CR of the target center wavelength $\lambda_T$ which is changed by the exposure apparatus control unit 40. For example, the wavelength change amount CR may be the maximum wavelength change amount within one burst oscillation period Tb. The wavelength change amount CR may be a value that is at least twice the width S of one section. The wavelength change amount CR may be smaller than the actual spectral linewidth $W_T$ of the pulsed laser beam PL. For example, the wavelength change amount CR may be 100 fm.

Furthermore, the wavelength frequency function generator 22d may standardize the wavelength frequency function $R(\lambda)$ so as to make the total integral be "1". The standardization is performed by obtaining the total integral of the wavelength frequency function $R(\lambda)$ and multiplying the wavelength frequency function $R(\lambda)$ with a reciprocal of the obtained integral.

In the first embodiment, a deconvolution processor 32 may perform deconvolution processing on the observed spectral waveform $O(\lambda)$ produced by an averaging processor 30, using the device function $I(\lambda)$ and the wavelength frequency function $R(\lambda)$. For example, the deconvolution processor 32 may perform the deconvolution processing to obtain the restored spectral waveform $Q(\lambda)$ that satisfies formula (11) below:

$$O(\lambda) = Q(\lambda) * I(\lambda) * R(\lambda) \qquad (11)$$
$$= \int_{-\infty}^{+\infty} Q(x) IR(\lambda - x) dx$$

Here, $IR(\lambda)$ may be a synthetic function represented by a convolution integral of the device function $I(\lambda)$ and the wavelength frequency function $R(\lambda)$, as expressed by formula (12) below:

$$IR(\lambda) = \int_{-\infty}^{+\infty} I(x) R(\lambda - x) dx \qquad (12)$$

The deconvolution processor 32 may perform convolution processing based on formula (12) above, thereby calculating synthetic function $IR(\lambda)$. Thereafter, with the calculated synthetic function $IR(\lambda)$, the deconvolution processor 32 may obtain the restored spectral waveform $Q(\lambda)$ that satisfies formula (11). An iterative method such as Jacobi s method and Gauss-Seidel method may be applied to the deconvolution processing.

The convolution and deconvolution processing performed by the deconvolution processor 32 may practically be an arithmetic operation using the discrete data. As described above, because the width S of one section of the wavelength frequency function $R(\lambda)$ is an integer multiple of the quantization unit $\Delta$ that represents the minimum data interval of the observed spectral waveform $O(\lambda)$, the deconvolution processor 32 can perform the arithmetic processing with high efficiency and at a high speed.

An E95 calculator 33 may calculate a spectral linewidth $W_D$ from the restored spectral waveform QUO produced through the deconvolution processing based on formula (12) above.

Other features of the narrowband laser apparatus according to the first embodiment may be similar to the features of the narrowband laser apparatus of the comparative example described above.

3.2 Operation 3.2.1 Process for Calculating Spectral Linewidth

Figure 16:
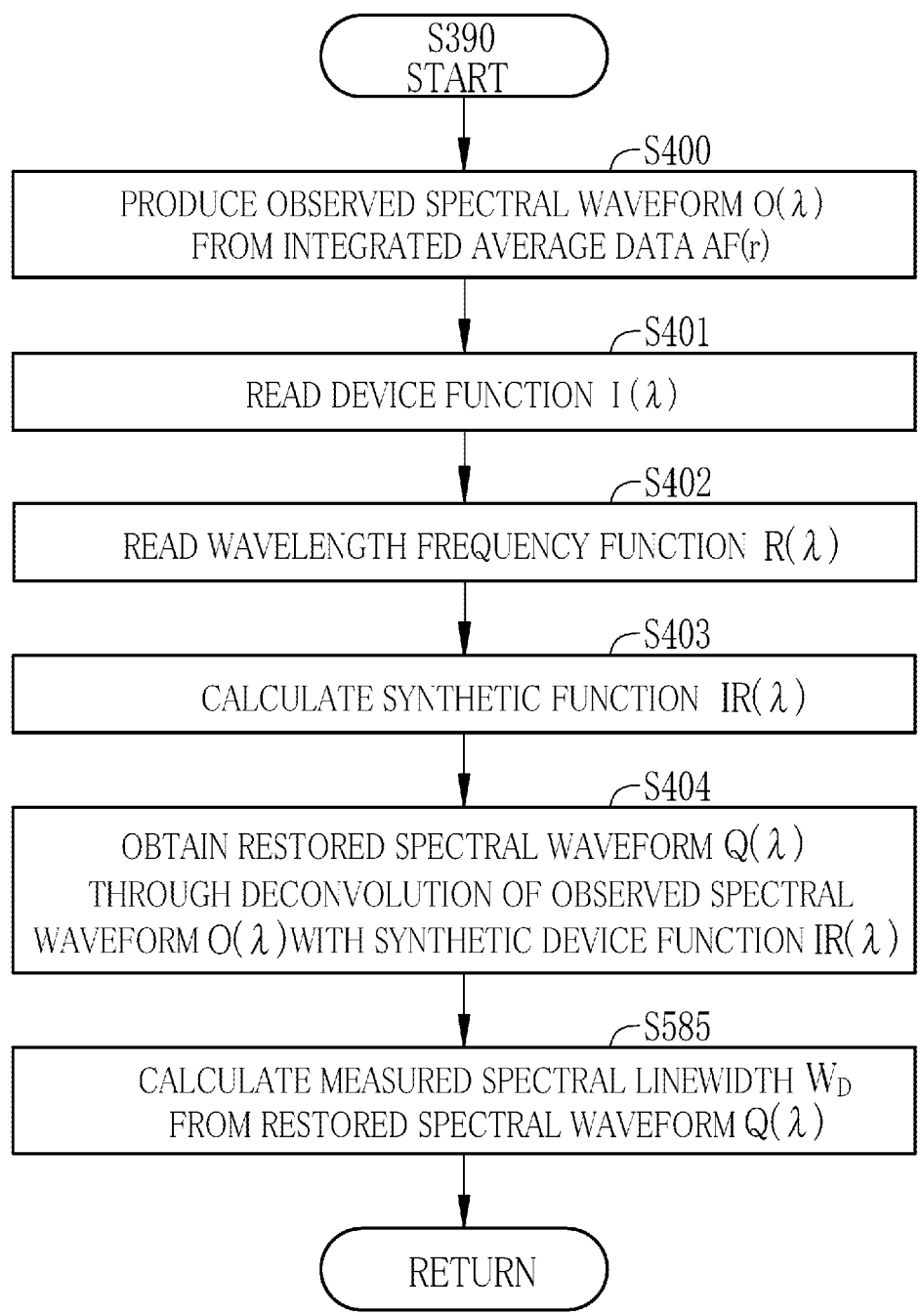
FIG. 16 is a subroutine illustrating a spectral linewidth calculation process in the first embodiment of the present disclosure.

FIG. 16 is a subroutine illustrating the spectral linewidth calculation process in the first embodiment of the present disclosure. In the first embodiment, the spectral linewidth calculator 22 shown in FIG. 14 may perform, as step S390 in the flowchart shown in FIG. 11, the subroutine shown in FIG. 16, instead of the subroutine shown in FIG. 12 of the comparative example.

In step S400 shown in FIG. 16, the spectral waveform calculator 31 included in an arithmetic processing unit 22c may produce the observed spectral waveform $O(\lambda)$ from integration average data AF(r) which is provided by an averaging processor 30 included in the arithmetic processing unit 22c. Next, in step S401, the deconvolution processor 32 included in the arithmetic processing unit 22c may read the device function $I(\lambda)$ stored in a device function storage 22a.

Then, in step S402, the deconvolution processor 32 may read the wavelength frequency function $R(\lambda)$ which is output from the wavelength frequency function generator 22d. Next, in S403, the deconvolution processor 32 may perform the convolution processing with the device function $I(\lambda)$ and the wavelength frequency function $R(\lambda)$ to calculate the synthetic function $IR(\lambda)$ on the basis of formula (12) above.

Thereafter, in step S404, the deconvolution processor 32 may perform the deconvolution processing with the synthetic function IR (λ) on the observed spectral waveform O(λ) to obtain the restored spectral waveform Q(λ) that satisfies formula (11) above. Then, in step S405, the E95 calculator 33 may calculate the measured spectral linewidth $W_D$ from the restored spectral waveform Q(λ).

3.2.2 Process for Generating Wavelength Frequency Function

Figure 17:
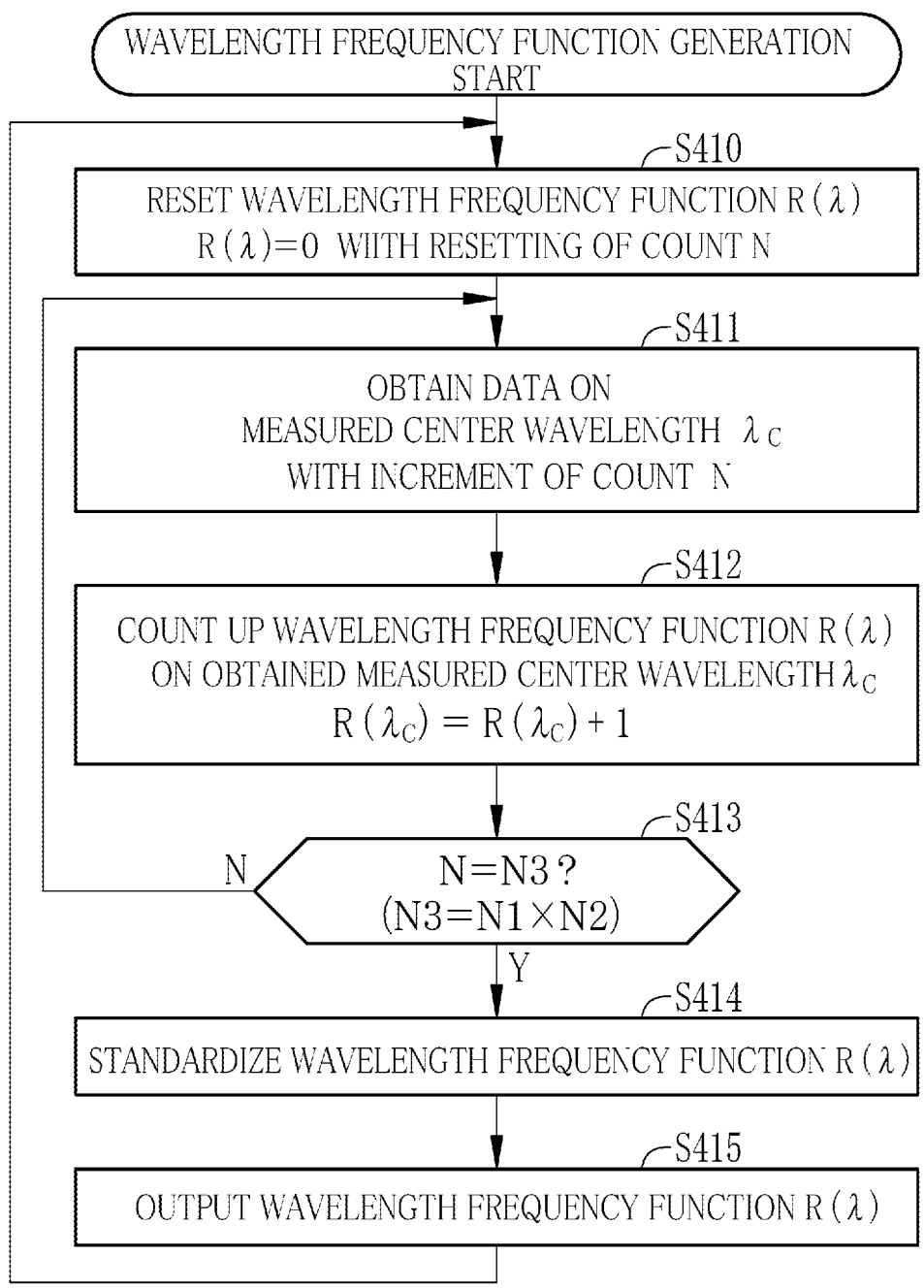
FIG. 17 is a flowchart illustrating a process for generating the wavelength frequency function by the wavelength frequency function generator 22d shown in FIG. 14.

FIG. 17 is a flowchart illustrating a process for generating the wavelength frequency function R(λ) by the wavelength frequency function generator 22d included in the spectral linewidth calculator 22 shown in FIG. 14. The wavelength frequency function generator 22d may generate the wavelength frequency function R(λ) through the following process.

The wavelength frequency function generator 22d may refer to the count N of the abovementioned counter 22b so as to operate in synchronism with the count N. First, in step S410, the wavelength frequency function generator 22d may reset the wavelength frequency function R(λ) to zero: R(λ)=0, in response to the counter 22b resetting the count N to zero: N=0.

Next, in step S411, the wavelength frequency function generator 22d may obtain data on the measured center wavelength $\lambda_C$, which is sent from the wavelength control unit 21, in response to one increment of the count N, that is, when the counter 22b adds "1" to the current count N.

Next, in step S412, the wavelength frequency function generator 22d may count up the wavelength frequency function R(λ) with respect to the obtained measured center wavelength $\Delta_C$. For example, the counting-up may be performed through a process expressed by "R($\lambda_C$)=R($\lambda_C$)+1", adding "1" to the frequency in the section that the obtained measured center wavelength $\lambda_C$ belongs to among the multiple sections of the wavelength frequency function R(λ).

Then, in step S413, the wavelength frequency function generator 22d may determine whether the count N is the third number N3. When the count N is not the third number N3 (S413; NO), the wavelength frequency function generator 22d may return to the abovementioned step S411. When the count N reaches the third number N3 (S413; YES), the wavelength frequency function generator 22d may proceed to step S414. When the process proceeds to step S414, the wavelength frequency function R(λ) may be generated from data consisting of N3 measured center wavelengths $\lambda_C$.

In step S414, the wavelength frequency function generator 22d may standardize the wavelength frequency function R(λ) so as to make the total integral be "1". The wavelength frequency function generator 22d may output the standardized wavelength frequency function R (λ) to the deconvolution processor 32. The wavelength frequency function R(λ) may be read in the deconvolution processor 32 in step S402 of the abovementioned subroutine shown in FIG. 16.

Thereafter, the process may be returned to the abovementioned step S410. The above-described process for generating the wavelength frequency function may be repeatedly performed during the burst oscillation period Tb.

Other operations of the narrowband laser apparatus according to the first embodiment may be similar to the above-described operations of the narrowband laser apparatus of the comparative example.

3.3 Effect

The effect of the narrowband laser apparatus according to the first embodiment will be described below. As described above concerning the problem, if the target center wavelength $\lambda_T$ is changed for each pulse P, the observed spectral waveform O(λ) can be a waveform which is provided by overlaying the second spectral waveforms T'(λ−x) as shown for example in FIG. 13. The overlay of the second spectral waveforms T'(X−x) may be expressed by formula (13) below, using the wavelength frequency function R(λ)

$$O(\lambda)=\int_{-\infty}^{+\infty}T'(\lambda-x)R(x)dx \qquad (13)$$

As a convolution integral, formula (13) above may be modified as shown in formula (14) below:

$$O(\lambda) = T'(\lambda) * R(\lambda) \qquad (14)$$
$$= T(\lambda) * I(\lambda) * R(\lambda)$$

Furthermore, formula (14) above may be modified as shown in formula (15) below:

$$O(\lambda) = T(\lambda) * IR(\lambda) \qquad (15)$$
$$= \int_{-\infty}^{+\infty} T(x)IR(\lambda - x)dx$$

In the first embodiment, because the deconvolution processing based on formula (11) above is performed using the synthetic function IR(λ), the restored spectral waveform Q(λ) obtained through the deconvolution processing can be substantially equal to the first spectral waveform T(λ). In other words, in the first embodiment, the influence of changing the target center wavelength $\lambda_T$ by the exposure apparatus control unit 40 can be eliminated from the restored spectral waveform Q(λ). Accordingly, the measured spectral linewidth $W_D$ calculated on the basis of the restored spectral waveform Q(λ) can be substantially equal to the actual spectral linewidth $W_T$ of the pulsed laser beam PL.

In the first embodiment, the deconvolution processor 32 performs the deconvolution processing using the synthetic function IR(λ) which is provided through the convolution processing with the device function I(λ) and the wavelength frequency function R(λ). However, the deconvolution processor 32 is not limited to this method, but may perform any aspect of the deconvolution processing on the observed spectral waveform O(λ), using the device function I(λ) and the wavelength frequency function R(λ).

For example, it may be possible for the deconvolution processor 32 to perform, on the observed spectral waveform O(λ), first deconvolution processing using the device function I(λ) and then second deconvolution processing using the wavelength frequency function R(λ). Alternatively, it may be possible for the deconvolution processor 32 to perform, on the observed spectral waveform O(λ), first deconvolution processing using the wavelength frequency function R(λ) and then second deconvolution processing using the device function I(λ).

In general, however, the deconvolution processing can take a longer time than the convolution processing. Therefore, in comparison with the case performing the deconvolution processing twice, the deconvolution processing using the synthetic function RI(λ) which is obtained through the convolution processing, as in the first embodiment, can be advantageous in terms of speeding the processing.

3.4 Modification Relating to Wavelength Frequency Function Generation 3.4.1 First Modification In the first embodiment, the wavelength frequency function generator 22d obtains data on the measured center wavelength $\lambda_C$ from the wavelength control unit 21. As a first modification of the first embodiment, the wavelength frequency function generator 22d may obtain data on the target center wavelength $\lambda_T$ from the wavelength control unit 21.

Figure 18:
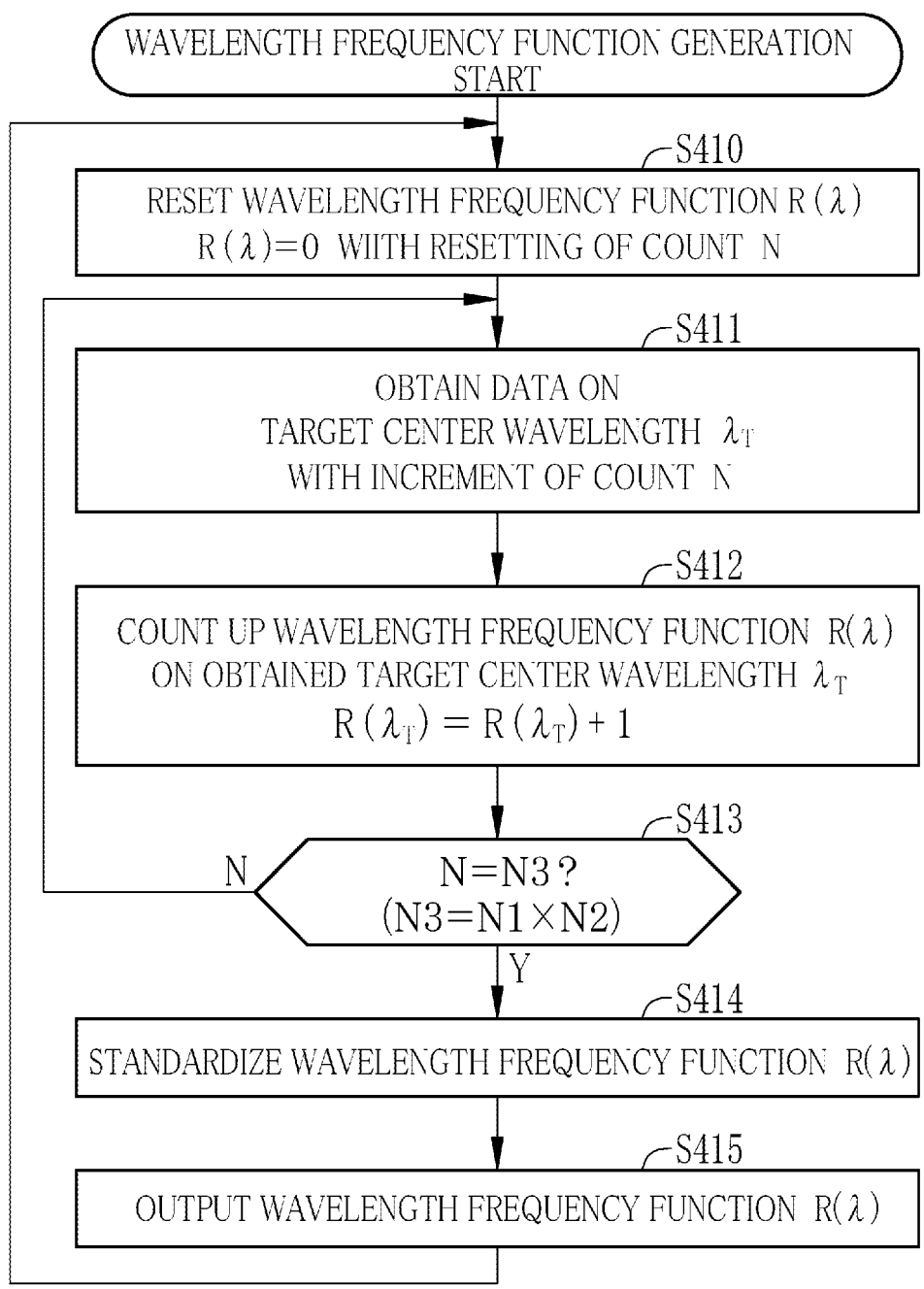
FIG. 18 is a flowchart illustrating a process for generating the wavelength frequency function according to a modification of the first embodiment.

FIG. 18 is a flowchart illustrating a process for generating the wavelength frequency function according to the first modification. The flowchart shown in FIG. 18 is not different from the flowchart of the first embodiment shown in FIG. 17, except for steps S411 and S412.

In the first modification, in step S411 shown in FIG. 18, the wavelength frequency function generator 22d may obtain data on the target center wavelength $\lambda_T$ from the wavelength control unit 21, the data corresponding to the pulse P output from the narrowband laser apparatus, in response to one increment of the count N.

Next, in step S412 shown in FIG. 18, the wavelength frequency function generator 22d may count up the wavelength frequency function $R(\lambda)$ with respect to the obtained target center wavelength $\lambda_T$. For example, the counting-up may be performed by adding to the frequency in the section that the obtained target center wavelength $\lambda_T$ belongs to among the multiple sections of the wavelength frequency function $R(\lambda)$. That is, the process expressed by "$R(\lambda_T)=R(\Delta_T)+1$" may be performed. Thus, in the first modification, the wavelength frequency function $R(\lambda)$ may be generated on the basis of the data on the target center wavelength $\lambda_T$.

Other features and operations of the first modification are similar to those of the first embodiment. Incidentally, the data on the target center wavelength $\lambda_T$ may be transmitted from the laser control unit 20 to the wavelength frequency function generator 22d through a signal line (not illustrated).

3.4.2 Second Modification

In the first embodiment, the data on the target center wavelength $\lambda_T$ is input to the laser control unit 20 for each individual pulse P in synchronism with the oscillation trigger signal. However, it may be possible to previously input data on multiple target center wavelengths $\lambda_T$ to the laser control unit 20 and store the data in a memory (not illustrated). For example, referring to FIG. 7, such target center wavelengths $\lambda_T$ that correspond to respective pulses P for the following burst oscillation period Tb may be input to the laser control unit 20 during the previous intermission period Tr.

In this second modification, the wavelength frequency function generator 22d may previously generate and store multiple wavelength frequency functions MA) during the intermission period Tr, for use in the following burst oscillation period Tb.

Other features and operations of the second modification are similar to those of the first modification.

3.5 Modification Relating to Numbers for Integration and Averaging

In the first embodiment, both the first number N1 representing the number of times for integration and the second number N2 representing the number of times for averaging are defined to be not less than 2. However, insofar as the third number N3 is not less than 2, the third number N3 being the product of the first number N1 and the second number N2, either the first number N1 or the second number N2 may be "1".

For example, when "N1=1", the line sensor 19d cannot integrate the interference pattern data $F_i(r)$. Therefore, the line sensor 19d can output the interference pattern data $F_i(r)$ not the integrated interference pattern data $SF_j(r)$.

Meanwhile, when "N2=1", the averaging processor 30 cannot actually perform the averaging. Therefore, the averaging processor 30 may not be an essential component, but may be omitted.

In the present disclosure, the integration may mean that a number of pieces of interference pattern data $F_i(r)$ are accumulated and added up in the line sensor 19d. In the present disclosure, the averaging may mean that a number of pieces of integrated interference pattern data $SF_j(r)$ or a number of pieces of interference pattern data $F_i(r)$ are added up and divided by the number of pieces added up in the arithmetic processing unit 22c. Accordingly, in the present disclosure, both the integration and the averaging may be such concepts that include addition of a number of pieces of interference pattern data $F_i(r)$.

3.6 Modification Relating to Production of Observed Spectral Waveform

In the first embodiment, the averaging processor 30 produces integration average data AF(r) by averaging a number of pieces of integrated interference pattern data $SF_j(r)$ and, thereafter, the spectral waveform calculator 31 can produce the observed spectral waveform $O(\lambda)$ on the basis of the integration average data AF(r). It may be possible to perform the averaging and spectral waveform producing process in the reversed order For example, the spectral waveform calculator 31 may first convert each of N2 pieces of integrated interference pattern data $SF_j(r)$, which has been received from the line sensor 19d, individually to a spectral waveform. Thereafter, the multiple spectral waveforms produced by the spectral waveform calculator 31 may be averaged by the averaging processor 30 to produce the observed spectral waveform $O(\lambda)$ In a case where "N1=1", the spectral waveform calculator 31 may, of course, convert each piece of interference pattern data $F_i(r)$ as received from the line sensor 19d to a spectral waveform. In a case where "N2=1", the averaging processor 30 may be omitted.

Note that the interference pattern may represent a spectral intensity distribution using the radiuses from the optical axis of the spectrometer as parameters, and the spectral waveform may represent the spectral intensity distribution using the wavelengths as parameters. Therefore, both the interference pattern and the spectral waveform may be data representing the "spectral intensity distribution" of the pulsed laser beam.

Accordingly, in the first embodiment, the averaging processor 30 and the spectral waveform calculator 31 constitute an "observed spectral waveform producer" which produces the observed spectral waveform $O(\lambda)$ by adding up spectral intensity distributions. The averaging processor 30 and the spectral waveform calculator 31 constitute an example of the observed spectral waveform producer.

4. Narrowband Laser Apparatus Measuring Spectral Linewidth Taking Account of Center Wavelength and Pulse Energy of Each Pulse (Second Embodiment)

The pulsed laser beam PL output from the narrowband laser apparatus may have pulse energy that varies from one pulse P to another. In such a case where the pulse energy varies from one pulse P to another, the restored spectral waveform $Q(\lambda)$ obtained by the comparative example corresponds to a waveform that is provided by overlaying the first spectral waveforms $T(\lambda-x)$ having different center wavelengths and different pulse energy values from each other.

Because the first embodiment performs the deconvolution processing with the wavelength frequency function $R(\lambda)$ that represents the frequency of appearance of the center wavelength, the influence of the difference in center wavelength between the individual pulses P can be eliminated from the restored spectral waveform $Q(\lambda)$. In the first embodiment, however, the influence of the difference in pulse energy between the individual pulses P cannot be eliminated from the restored spectral waveform $Q(\lambda)$.

4.1 Configuration

Figure 19:
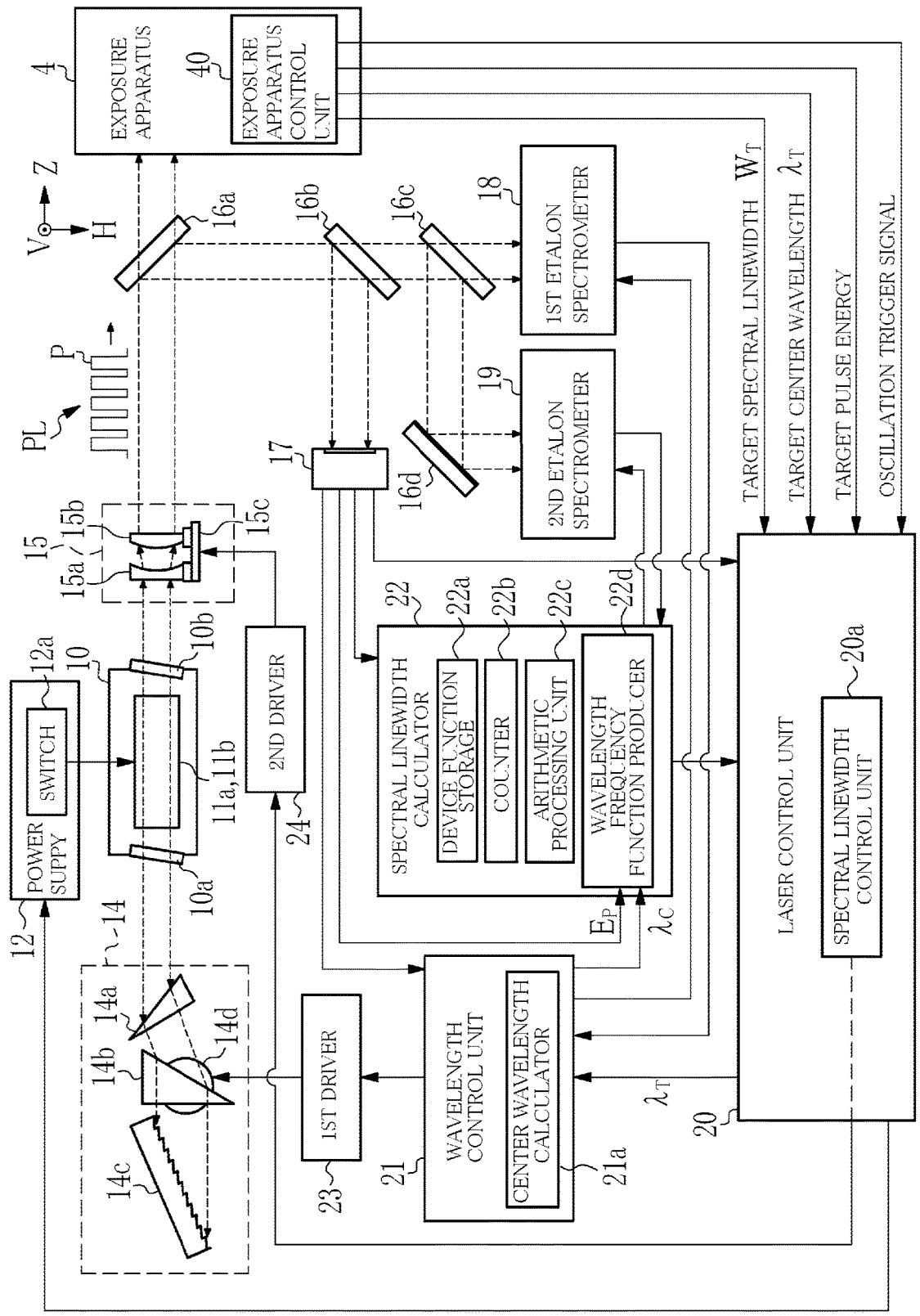
FIG. 19 is a diagram schematically illustrating a configuration of a narrowband laser apparatus according to a second embodiment of the present disclosure.

FIG. 19 schematically shows a configuration of a narrowband laser apparatus according to a second embodiment of the present disclosure. In the second embodiment, the narrowband laser apparatus may be provided with a signal line for transmitting data on pulse energy $E_P$ of each pulse P from an energy sensor 17 to a wavelength frequency function generator 22d, in addition to the configuration of the first embodiment shown in FIG. 14.

A wavelength control unit 21 may output data on the measured center wavelength $\lambda_C$ to the wavelength frequency function generator 22d every time a center wavelength calculator 21a calculates the measured center wavelength $\lambda_C$. The energy sensor 17 may output data on pulse energy $E_P$ to the wavelength frequency function generator 22d every time the energy sensor 17 measures the pulse energy $E_P$ of each pulse P. The wavelength frequency function generator 22d receives the data on the measured center wavelength $\lambda_C$ from the wavelength control unit 21 and the data on the pulse energy $E_P$ from the energy sensor 17.

In the second embodiment, the wavelength frequency function generator 22d may divide the wavelength range into several sections and calculate the sum of the pulse energy $E_P$ of the pulses P for each section, thereby to generate a wavelength frequency function $R(\lambda)$. Every time the count N of a counter 22b reaches the third number N3, the wavelength frequency function generator 22d may generate the wavelength frequency function $R(\lambda)$ from N3 pieces of data on the measured center wavelength $\lambda_C$ and pulse energy $E_P$.

4.2 Operation 4.2.1 Process for Generating Wavelength Frequency Function

Figure 20:
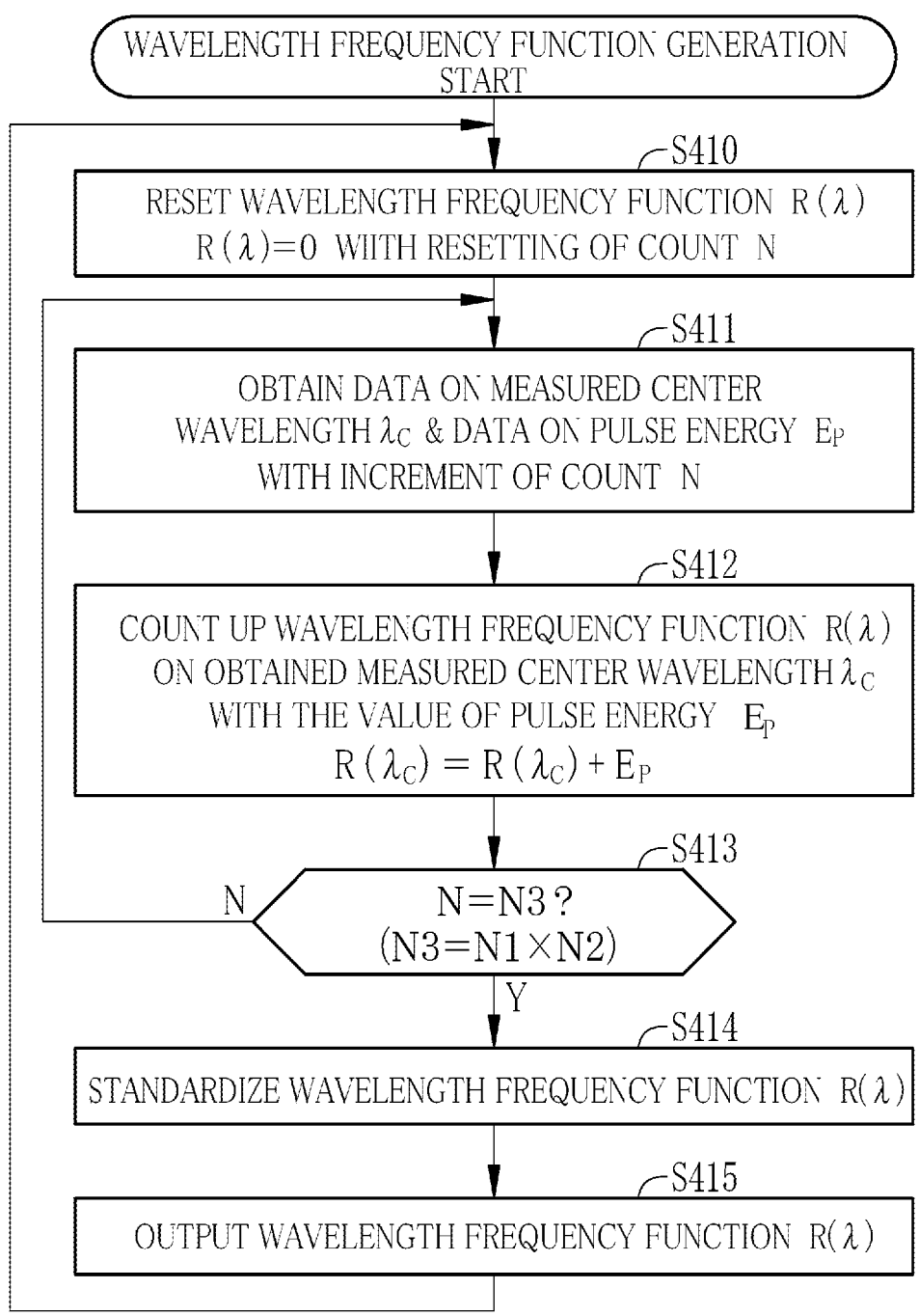
FIG. 20 is a flowchart illustrating a process for generating the wavelength frequency function by a wavelength frequency function generator 22d shown in FIG. 19.

FIG. 20 is a flowchart illustrating a process for generating the wavelength frequency function by the wavelength frequency function generator 22d included in a spectral linewidth calculator 22 shown in FIG. 19. The flowchart shown in FIG. 20 is not different from the flowchart of the first embodiment shown in FIG. 17, except for steps S411 and S412.

In the second embodiment, in step S411 shown in FIG. 20, the wavelength frequency function generator 22d may obtain data on the measured center wavelength $\lambda_C$ and data on the pulse energy $E_P$, which correspond to the pulse P output from the narrowband laser apparatus in response to one increment of the count N. The wavelength frequency function generator 22d may obtain the data on the measured center wavelength $\lambda_C$ from the center wavelength calculator 21a and the data on the pulse energy $E_P$ from the energy sensor 17.

Figure 21:
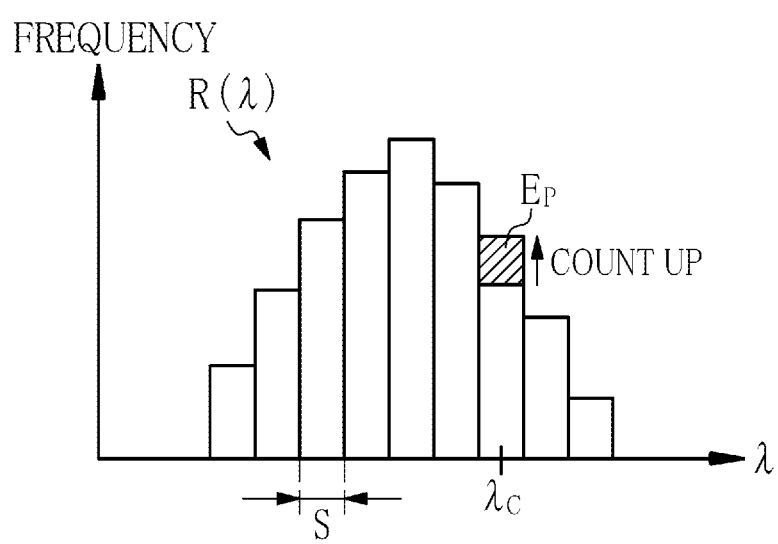
FIG. 21 is a diagram for explaining counting-up of the wavelength frequency function $R(\lambda)$ in the second embodiment of the present disclosure.

Next, in step S412 shown in FIG. 20, the wavelength frequency function generator 22d may count up the wavelength, frequency function $R(\lambda)$ relating to the obtained measured center wavelength $\lambda_C$ with the value of the pulse energy $E_P$. For example, as shown in FIG. 21, the counting-up may be performed by adding the value of the pulse energy $E_P$ to the frequency in the section that the obtained measured center wavelength $\lambda_C$ belongs to. That is, the counting-up may be a process expressed by "$R(\lambda_C)=R(\lambda_C)+E_P$". Thus, the wavelength frequency function $R(\lambda)$ may be generated on the basis of the data on the measured center wavelength $\lambda_C$ and the data on the pulse energy $E_P$.

Other features and operations of the narrowband laser apparatus according to the second embodiment may be similar to those of the narrowband laser apparatus according to the first embodiment.

4.3 Effect

The effects of the narrowband laser apparatus according to the second embodiment will be described below. In the second embodiment, because the wavelength frequency function $R(\lambda)$ is generated on the basis of the data on the measured center wavelength $\lambda_C$ and the data on the pulse energy $E_P$, the wavelength frequency function $R(\lambda)$ can reflect the influence of the difference in center wavelength and pulse energy between the individual pulses P. Therefore, the influence of the difference in center wavelength and pulse energy between the individual pulses P can be eliminated from the restored spectral waveform $Q(\lambda)$ which is obtained through deconvolution processing with this wavelength frequency function $R(\lambda)$. Furthermore, in the second embodiment, the measured spectral linewidth $W_D$ calculated on the basis of the restored spectral waveform $Q(\lambda)$ can be closer to the actual spectral linewidth $W_T$ of the pulsed laser beam PL.

4.4 Modification

In the second embodiment, the wavelength frequency function generator 22d obtains data on the measured center wavelength $\lambda_C$ from the wavelength control unit 21. As an alternative, the wavelength frequency function generator 22d may obtain data on the target center wavelength $\lambda_T$ from the wavelength control unit 21. Therefore, with regard to the process for generating the wavelength frequency function, the second embodiment may be modified in the same manner as for the first embodiment.

Furthermore, the second embodiment may also be modified in the same manner as for the first embodiment with regard to the numbers for the integration and averaging, as well as the process for producing the observed spectral waveform.

5. Narrowband Laser Apparatus Calculating Measured Spectral Linewidth While Shifting Wavelength of Each Spectral Waveform (Third Embodiment)

Figure 22:
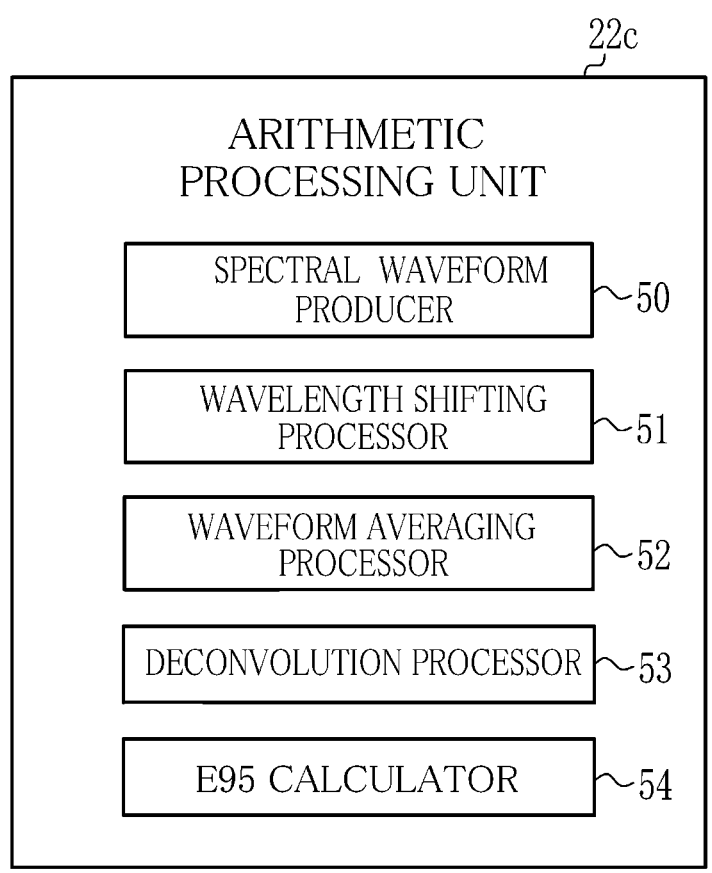
FIG. 22 is a diagram illustrating a configuration of an arithmetic processing unit 22c in a third embodiment of the present disclosure.

A narrowband laser apparatus according to a third embodiment of the present disclosure may have the same features as the comparative example described above with reference to FIG. 1, except for the feature of an arithmetic processing unit 22c included in a spectral linewidth calculator 22. FIG. 22 shows a configuration of the arithmetic processing unit 22c in the third embodiment. The arithmetic processing unit 22c may include a spectral waveform producer 50, a wavelength shifting processor 51, a waveform averaging processor 52, a deconvolution processor 53, and an E95 calculator 54.

In the third embodiment, a counter 22b may output the abovementioned data output trigger to a line sensor 19d included in a second etalon spectrometer 19 every time the counter 22b increments the count N of detection signals from an energy sensor 17 by "1". The second etalon spectrometer 19 may output interference pattern data $F_i(r)$ to the arithmetic processing unit 22c of the spectral linewidth calculator 22 every time the second etalon spectrometer 19 receives one pulse P of the pulsed laser beam PL.

Every time the arithmetic processing unit 22c receives the interference pattern data $F_i(r)$ of one pulse, the spectral waveform producer 50 may calculate a spectral waveform on the basis of formula (2) above. The spectral waveform calculated by the spectral waveform producer 50 may correspond to the abovementioned second spectral waveform T'(λ).

The wavelength shifting processor 51 may calculate a center wavelength $\lambda_{Ci}$ of each spectral waveform produced by the spectral waveform producer 50 and may shift the wavelengths of each spectral waveform so as to make the center wavelength $\lambda_{Ci}$ of each spectral waveform substantially equal to others.

Every time the count N reaches the first number N1 and the arithmetic processing unit 22c receives N1 pieces of interference pattern data $F_i(r)$, the waveform averaging processor 52 may average N1 spectral waveforms after having the wavelengths shifted by the wavelength shifting processor 51. Through this averaging, the observed spectral waveform O(λ) may be produced.

The deconvolution processor 53 may have the same configuration as the deconvolution processor 32 of the comparative example. The deconvolution processor 53 may perform deconvolution processing on the observed spectral waveform O(λ) produced through the averaging by the waveform averaging processor 52, using a device function I(λ) stored in a device function storage 22a. For example, the deconvolution processor 53 may perform the deconvolution processing for obtaining the restored spectral waveform Q(λ) that satisfies formula (7) above.

The E95 calculator 54 may have the same configuration as the E95 calculator 33 of the comparative example. The E95 calculator 54 may calculate spectral purity E95 as data on the measured spectral linewidth. $W_D$ from the restored spectral waveform Q(λ) produced by the deconvolution processor 53. The E95 calculator 54 may output the calculated data on the measured spectral linewidth $W_D$ to a laser control unit 20.

5.1 Operation
5.1.1 Process for Calculating Spectral Linewidth

Figure 23:
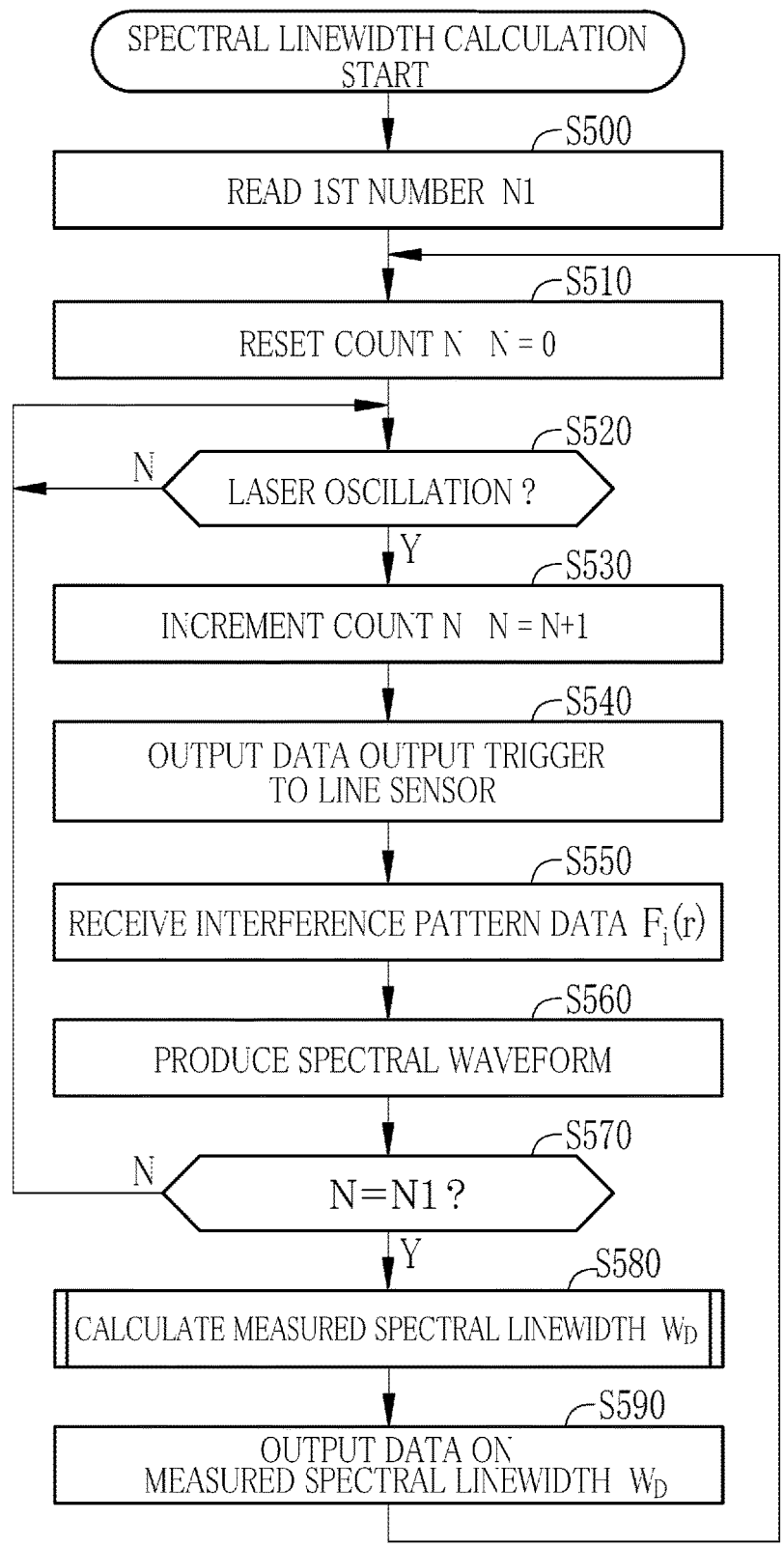
FIG. 23 is a flowchart illustrating a spectral linewidth calculation process by a spectral linewidth calculator 22 in the third embodiment of the present disclosure.

FIG. 23 is a flowchart illustrating the spectral linewidth calculation process by the spectral linewidth calculator 22 in the third embodiment. Through the following process, the spectral linewidth calculator 22 may calculate the spectral linewidth of the pulsed laser beam PL generated by the narrowband laser apparatus.

First, in step S500, the spectral linewidth calculator 22 may read data on the first number N1 from a memory (not illustrated) of the laser control unit 20. The following process may be performed during the burst oscillation of the pulsed laser beam PL.

In step S51€3, the counter 22b may reset the count N to be "N=0". Next, in step S520, the counter 22b may determine whether the narrowband laser apparatus has started the laser oscillation. For example, upon receipt of one detection signal from the energy sensor 17, the counter 22b may determine that the narrowband laser apparatus has started the laser oscillation. While the narrowband laser apparatus is not performing the laser oscillation (S520; NO), the counter 22b may stand by until the narrowband laser apparatus starts the laser oscillation. The counter 22b may proceed to step S530 when the narrowband laser apparatus starts the laser oscillation (S520; YES).

In step 530, the counter 22b may increment the count N. For example, the counter 22b may add "1" to the current count N. At that time, a part of the pulsed laser beam PL enters the second etalon spectrometer 19, so that the line sensor 19d is exposed to an interference pattern through the etalon 19b. Thus, in the line sensor 19d, the interference pattern data $F_i(r)$ may be obtained.

Next, in step S540, the spectral linewidth calculator 22 may output the data output trigger to the line sensor 19d of the second etalon spectrometer 19. Then, in step S550, the spectral linewidth calculator 22 may receive the interference pattern data $F_i(r)$ which is output from the line sensor 19d upon the data output trigger being input to the line sensor 19d. The interference pattern data $F_i(r)$ received by the spectral linewidth calculator 22 may be input to the spectral waveform producer 50 included in the arithmetic processing unit 22c.

Next, in step S560, the spectral waveform producer 50 may produce a spectral waveform on the basis of formula (2), using the interference pattern data $F_i(r)$ input to the arithmetic processing unit 22c.

Then, in step S570, the spectral linewidth calculator 22 may determine whether the count N is the first number N1. When the count N is not the first number N1 (S570: NO), the spectral linewidth calculator 22 may return to the abovementioned step S520. When the count N reaches the first number N1 (S570; YES), the spectral linewidth calculator 22 may proceed to step S580. When the process proceeds to step S580, N1 spectral waveforms may be produced by the spectral waveform producer 50.

Figure 24:
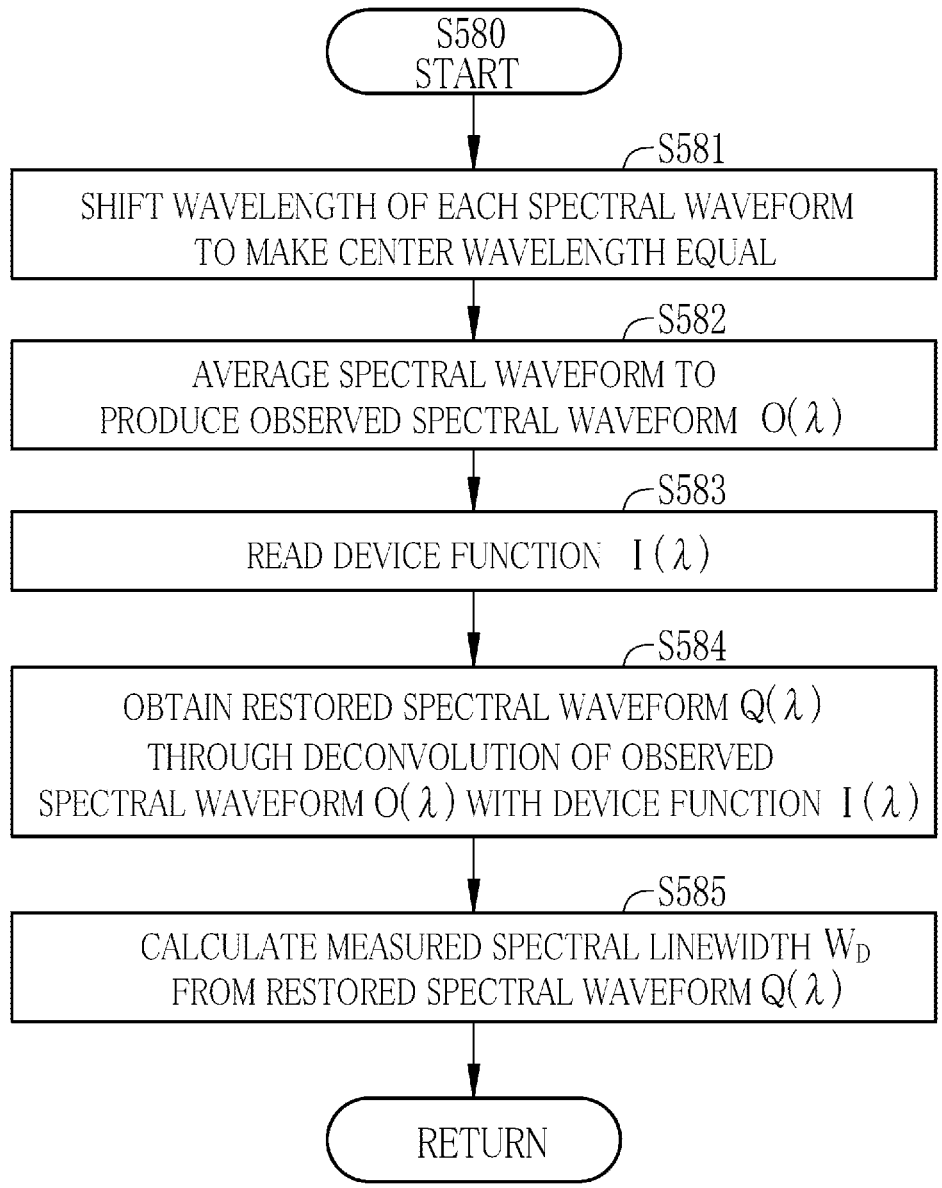
FIG. 24 is a flowchart illustrating a subroutine as a part of the flowchart shown in FIG. 23.

In step S580, a subroutine shown in FIG. 24 may be referred to. In step S581 shown in FIG. 24, the wavelength shifting processor 51 may calculate the center wavelength $\lambda_{Ci}$ of each of the N1 spectral waveforms produced by the spectral waveform producer 50, and may shift the wavelengths of each spectral waveform so as to make the center wavelength $\lambda_{Ci}$ of each spectral waveform substantially equal to others.

Next, in step S582, the waveform averaging processor 52 may average the N1 spectral waveforms after having the wavelengths shifted by the wavelength shifting processor 51, thereby to produce the observed spectral waveform O(λ). Then, in step S583, the deconvolution processor 53 may read the device function I(λ) stored in the device function storage 22a. Thereafter, in step S584, the deconvolution processor 53 may perform the deconvolution processing on the observed spectral waveform O(λ) with the device function I(λ), to obtain the restored spectral waveform Q(λ) that satisfies formula (7) above.

Next, in step S585, the E95 calculator 54 may calculate the measured spectral linewidth $W_D$ from the restored spectral waveform Q(λ). Then, the process may return to the flowchart shown in FIG. 23, and, in step S590, the spectral linewidth calculator 22 may output data on the measured spectral linewidth $W_D$, calculated by the E95 calculator 54, to the spectral linewidth control unit 20a.

Next, the process may return to the aforementioned step S510 shown in FIG. 23. The spectral linewidth measuring process described so far may be repeatedly performed during the burst oscillation period Tb. Note that the first number N1 may be 2 or higher in the third embodiment.

Other features and operations of the narrowband laser apparatus according to the third embodiment may be similar to those of the narrowband laser apparatus of the comparative example.

5.2 Effect

Figure 25:
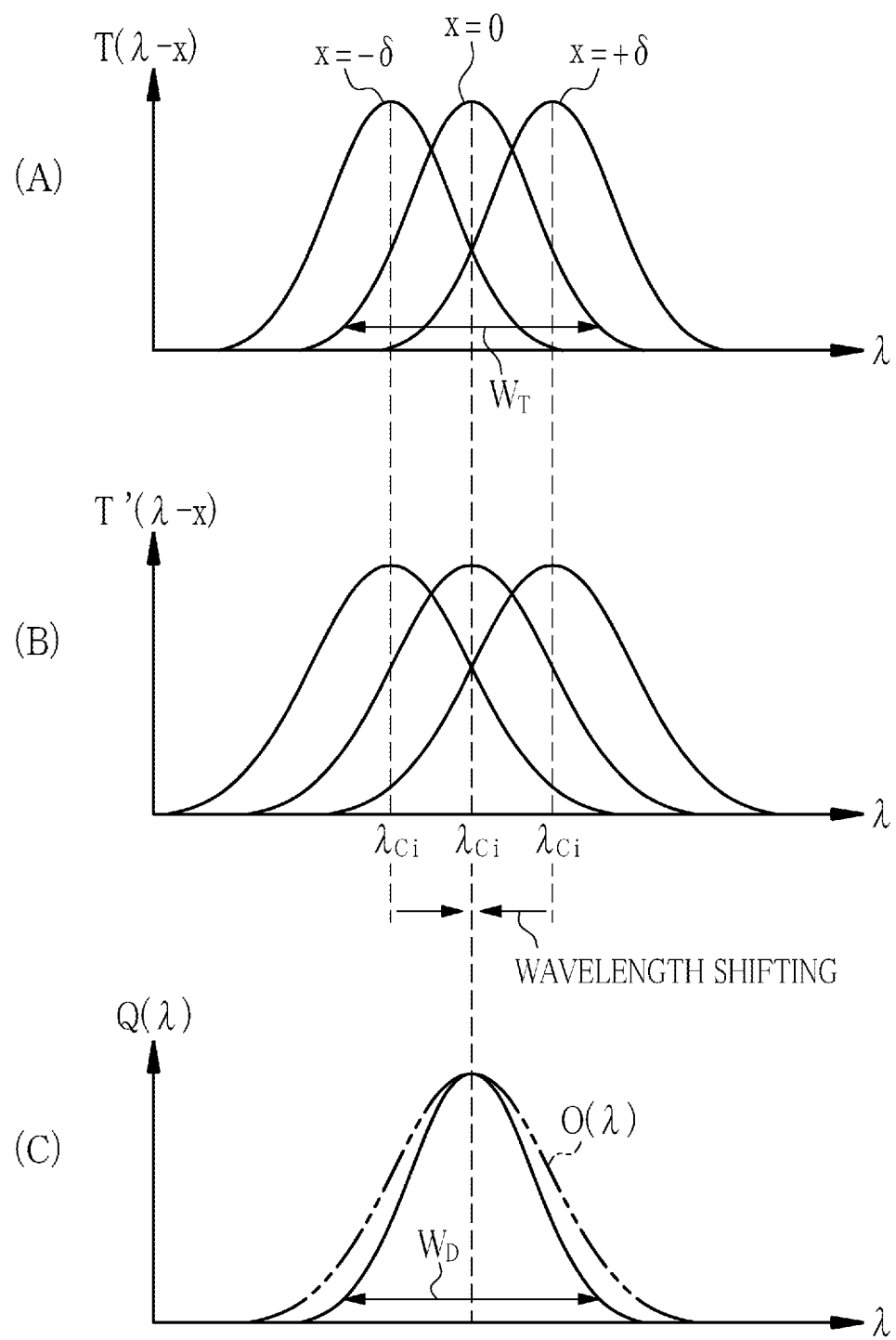
FIG. 25 shows diagrams for explaining the effect provided by the narrowband laser apparatus according to the third embodiment of the present disclosure: (A) a diagram illustrating an example of first spectral waveforms $T(\lambda-x)$, (B) a diagram illustrating an example of second spectral waveforms $T'(X-x)$, and (C) a diagram illustrating an example of an observed spectral waveform $O(\lambda)$ and a restored spectral waveform $Q(\lambda)$.

FIG. 25 shows diagrams for explaining the effect provided by the narrowband laser apparatus according to the third embodiment of the present disclosure. FIG. 25(A) exemplifies first spectral waveforms T(λ–x) of which the center wavelengths vary from one another with the target center wavelength $\lambda_T$ being changed by an exposure apparatus control unit 40. FIG. 25(B) exemplifies second spectral waveforms T'(λ-x) which correspond to spectral waveforms produced by the spectral waveform producer 50. FIG. 25(C) exemplifies the observed spectral waveform O(λ) produced through the processing by the wavelength shifting processor 51 and the waveform averaging processor 52, and the restored spectral waveform Q(λ) produced by the deconvolution processor 53.

In the third embodiment, the observed spectral waveform O(λ) may be produced by averaging multiple spectral waveforms after shifting the wavelengths of the spectral waveforms so as to make the center wavelengths thereof, which are originally different from each other, equal to each other. Therefore, the restored spectral waveform Q(λ) obtained through the deconvolution processing can be substantially equal to the first spectral waveform T(λ). That is, in the third embodiment, the influence of changing the target center wavelength $\lambda_T$ by the exposure apparatus control unit 40 can be eliminated from the restored spectral waveform Q (λ). Accordingly, the measured spectral linewidth $W_D$ calculated on the basis of the restored spectral waveform Q(λ) can be substantially equal to the actual spectral linewidth $W_T$ of the pulsed laser beam PL.

5.3 Variation of Center Wavelength for Use in Wavelength Shifting

In the third embodiment, the wavelength shifting processor 51 may calculate the center wavelength $\lambda_{Ci}$ of each spectral waveform produced by the spectral waveform producer 50, and may shift the wavelengths of each spectral waveform on the basis of the center wavelength $\lambda_{Ci}$. As an alternative, the wavelength shifting processor 51 may shift the wavelengths of each spectral waveform on the basis of the measured center wavelength $\lambda_C$ which is calculated by a center wavelength calculator 21a included in a wavelength control unit 21. Furthermore, the wavelength shifting processor 51 may also shift the wavelengths of each spectral waveform on the basis of the abovementioned target center wavelength $\lambda_T$.

6. Variation of Second Etalon Spectrometer (Fourth Embodiment)

Figure 26:
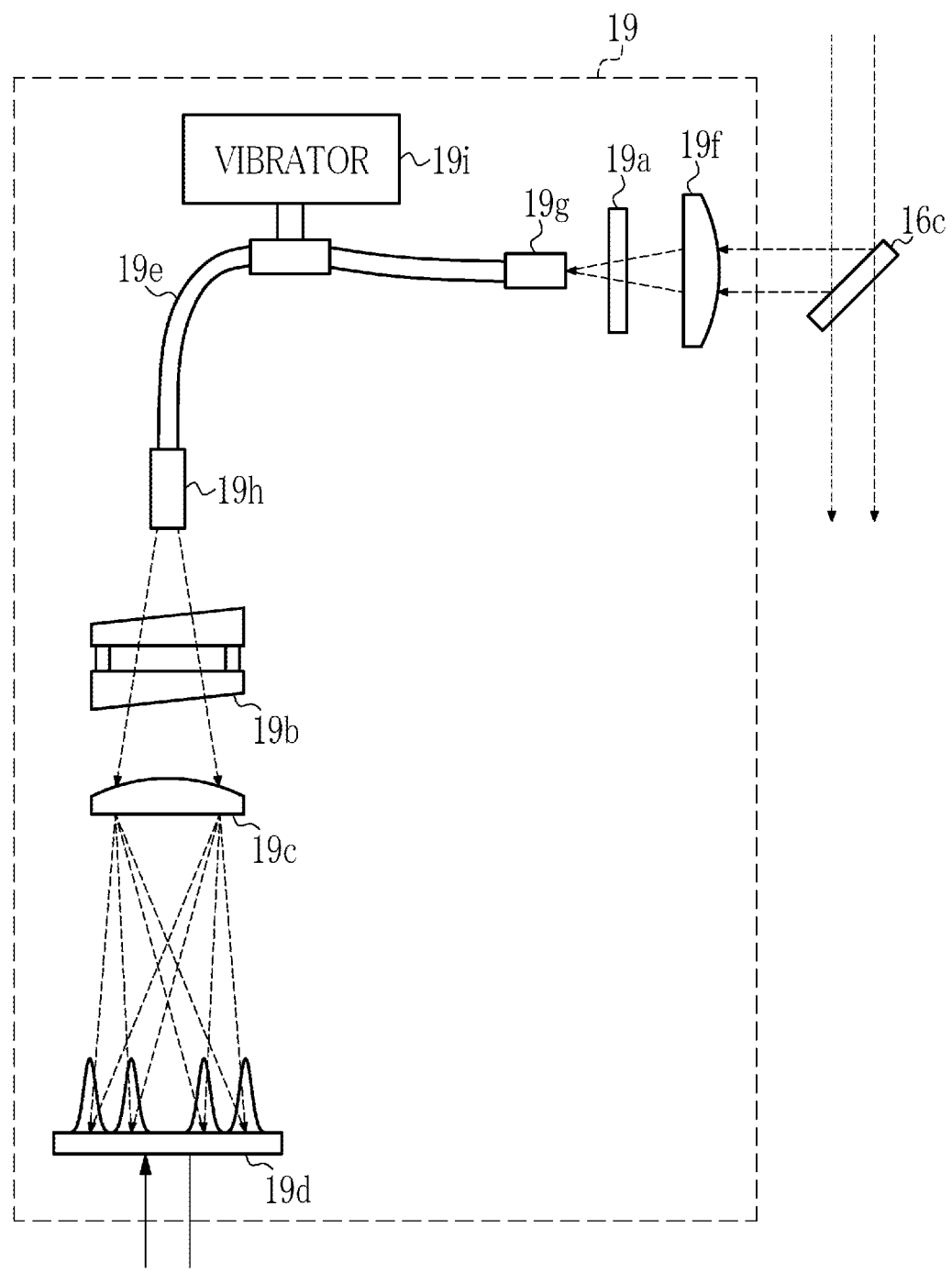
FIG. 26 is a diagram illustrating a configuration of an etalon spectrometer 19 used in a narrowband laser apparatus according to a fourth embodiment of the present disclosure.

FIG. 26 illustrates a configuration of a second etalon spectrometer 19 used in a narrowband laser apparatus according to a fourth embodiment of the present disclosure. In the fourth embodiment, the second etalon spectrometer 19 may include an optical fiber 19e which is disposed between a diffusion plate 19a and an etalon 19b.

A light condensing lens 19f may be disposed between a beam splitter 16c and the diffusion plate 19a. Condensing the pulsed laser beam through the light condensing lens 19f may cause scattering light, which has been transmitted through the diffusion plate 19a, to enter an inlet end 19g of the optical fiber 19e. The scattering light entered the inlet end 19g of the optical fiber 19e may exit from an outlet end 19h of the optical fiber 19e toward the etalon 19b.

The second etalon spectrometer 19 may further be provided with a vibrator 19i which vibrates the optical fiber 19e. The vibrator 19i may be provided with an actuator (not illustrated) In the fourth embodiment, the high reflection mirror 16d may be omitted.

If coherency of the pulsed laser beam is high, vibrating the optical fiber 19e by the vibrator 19i can reduce a speckle noise that can be added to the interference patterns. This can result in improving the accuracy of measurement of the spectral linewidth and center wavelength of the pulsed laser beam.

7. Narrowband Laser Apparatus Controlling Spectral Linewidth by Synchronization Between MO and PO (Fifth Embodiment)

Figure 27:
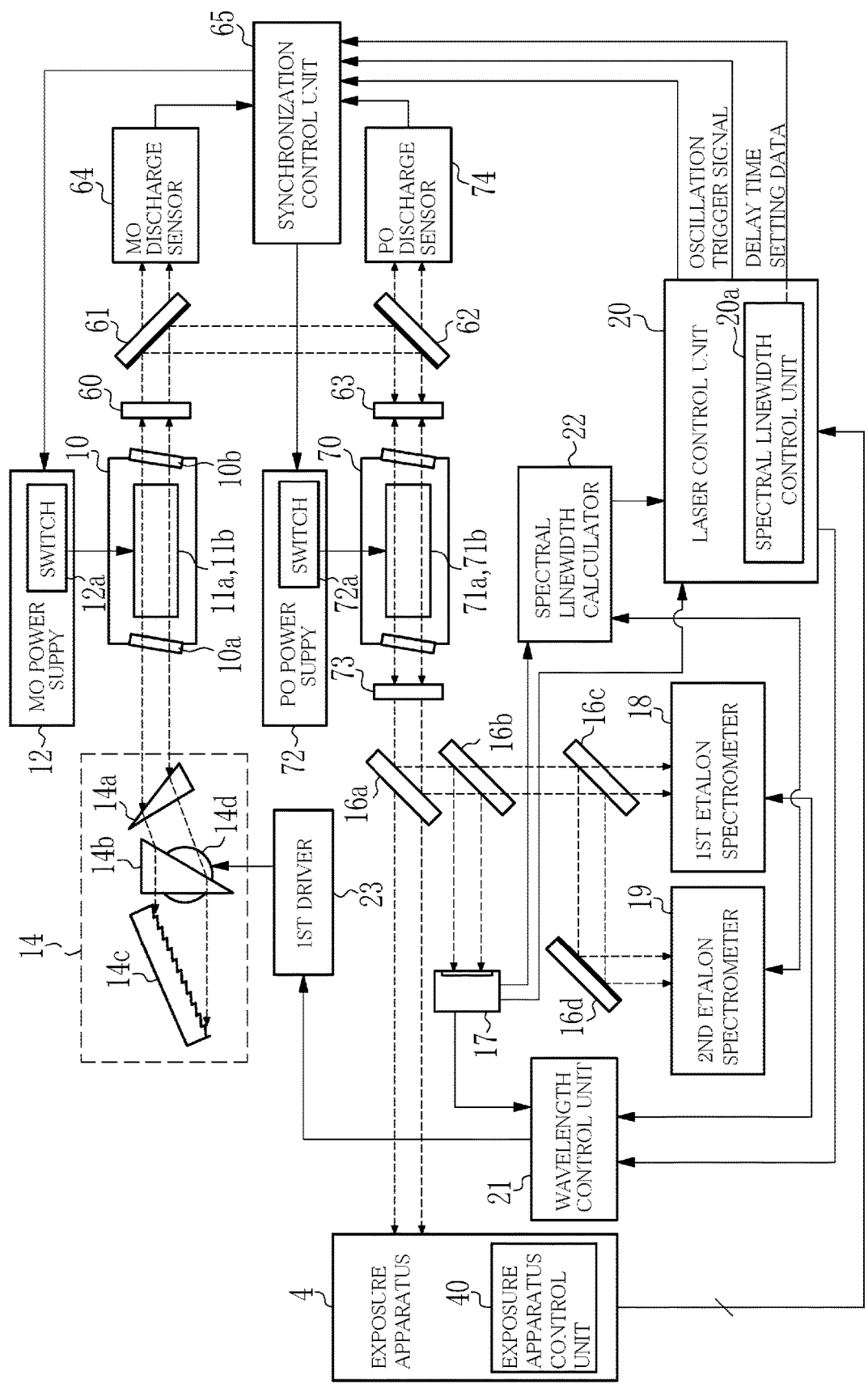
FIG. 27 is a diagram schematically illustrating a configuration of a narrowband laser apparatus according to a fifth embodiment of the present disclosure.

FIG. 27 schematically illustrates a configuration of a narrowband laser apparatus according to a fifth embodiment of the present disclosure. The narrowband laser apparatus according to the fifth embodiment is configured to dispose an output coupler 60, high reflection mirrors 61 and 62, and a power oscillator between a laser chamber 10 and a first beam splitter 16a in addition to the configuration of the narrowband laser apparatus according to the first embodiment, but the spectral linewidth modifier 15 may be omitted.

The output coupler 60 may be a partial reflection mirror and may not need to be capable of adjusting the wave surface. The output coupler 60 may partly reflect light having oscillation wavelengths of the narrowband laser apparatus, and may be coated with a film which transmits visible discharge rays at high transmittance, the visible discharge rays being generated by the discharge between a pair of discharge electrodes 11a and 11b.

In the fifth embodiment, a master oscillator (MO) may include the laser chamber 10, the pair of discharge electrodes 11a and 11b, an MO power supply 12, a line narrowing module 14, the output coupler 60, and a charger (not illustrated).

The pulsed laser beam after being output from the output coupler 60 may be reflected at high reflectance from the high reflection mirrors 61 and 62 and thus directed to a rear mirror 63 of the power oscillator (PO). The high reflection mirrors 61 and 62 may be coated with a film which transmits the visible discharge rays. Among rays generated by the discharge between the pair of discharge electrodes 11a and 11b, a part of the visible rays may be transmitted through the output coupler 60 and the high reflection mirror 61 and thus directed to an MO discharge sensor 64. The MO discharge sensor 64 may be configured to detect, from the visible rays transmitted through the output coupler 60 and the high reflection mirror 61, the timing of discharge between the pair of discharge electrodes 11a and 11b of the master oscillator. A signal indicating discharge timing may be output to a synchronization control unit 65.

The power oscillator may include a laser chamber 70, a pair of discharge electrodes 71a and 71b, a PO power supply 72, and a charger (not illustrated). These components may be configured in the same manner as the corresponding components of the master oscillator. The power oscillator may further include the rear mirror 63 and an output coupler 73. The rear mirror 63 and the output coupler 73 may be partial reflection mirrors, and may constitute an optical resonator. The output coupler 73 may be coated with a film which partially reflects rays of such wavelengths that provide the laser oscillation. Here, the reflectance of the partial reflection film of the output coupler 73 may be in a range of 10% to 30%.

The pulsed laser beam from the high reflection mirror 62 may be incident on the rear mirror 63, and a part of the pulsed laser beam incident on the rear mirror 63 may be introduced in the laser chamber 70 and then amplified while being reciprocated between the output coupler 73 and the rear mirror 63. The laser apparatus outputting the pulsed laser beam, which is output from the master oscillator and thereafter amplified by the power oscillator, is called MOPO type laser apparatus.

The rear mirror 63 may be coated with a film which partially reflects rays of such wavelengths that provide the laser oscillation and transmits visible discharge rays at high transmittance. Here, the reflectance of the partial reflection film of the rear mirror 63 may be in a range of 70% to 90%. Among rays generated by the discharge between the pair of discharge electrodes 71a and 71b, a part of visible rays may be directed to a PO discharge sensor 74 through the rear mirror 63 and the high reflection mirror 62. The PO discharge sensor 74 may be configured to detect, from the visible rays transmitted through the rear mirror 63 and the high reflection mirror 62, the timing of discharge between the pair of discharge electrodes 71a and 71b of the power oscillator. A signal indicating discharge timing may be output to the synchronization control unit 65.

A laser control unit 20 may output an oscillation trigger signal to the synchronization control unit 65. The synchronization control unit 65 may output, on the basis of the oscillation trigger signal received from the laser control unit 20, a first switching signal to a switch 12a of the MO power supply 12 of the master oscillator, and a second switching signal to a switch 72a of the PO power supply 72 of the power oscillator. Here, the synchronization control unit 65 may control the timing of the first and second switching signals so as to provide a desirable delay time in discharge timing in the power oscillator relative to discharge timing in the master oscillator.

Figure 28:
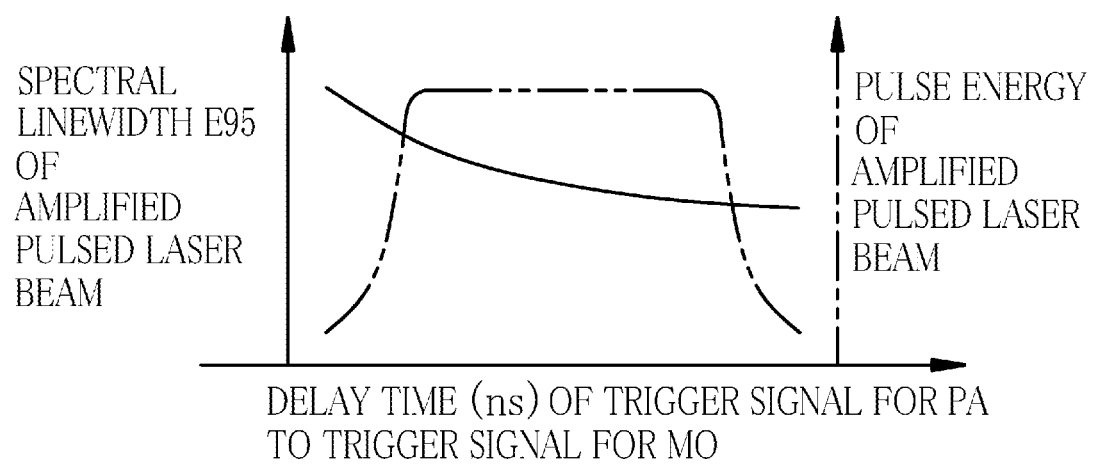
FIG. 28 is a diagram illustrating a relation between delay time in discharge timing of a master oscillator and that of a power oscillator, pulse energy, and spectral linewidth in an MOPO type laser apparatus.

FIG. 28 is a diagram illustrating a relation between the delay time in discharge timing from the master oscillator to the power oscillator, the pulse energy, and the spectral linewidth in the MOPO type laser apparatus. As shown in FIG. 28, if the delay time in discharge timing from the master oscillator to the power oscillator is within a tolerable range, the pulse energy of the pulsed laser beam output from the power oscillator can be substantially constant. However, even in this tolerable range, the spectral linewidth of the pulsed laser beam output from the power oscillator can vary depending on the delay time in discharge timing between the master oscillator and the power oscillator. Specifically, the spectral linewidth can become narrower, the longer the delay time becomes Therefore, in the fifth embodiment, the spectral linewidth may be controlled by adjusting the delay time in discharge timing between the master oscillator and the power oscillator.

Other features of the fifth embodiment may be similar to those of the first to fourth embodiment Although a Fabry-Perot type resonator is shown as an example of the optical resonator of the power oscillator in the fifth embodiment, the optical resonator is not limited thereto but may be a ring type resonator.

8. Configuration of Control Unit

Figure 29:
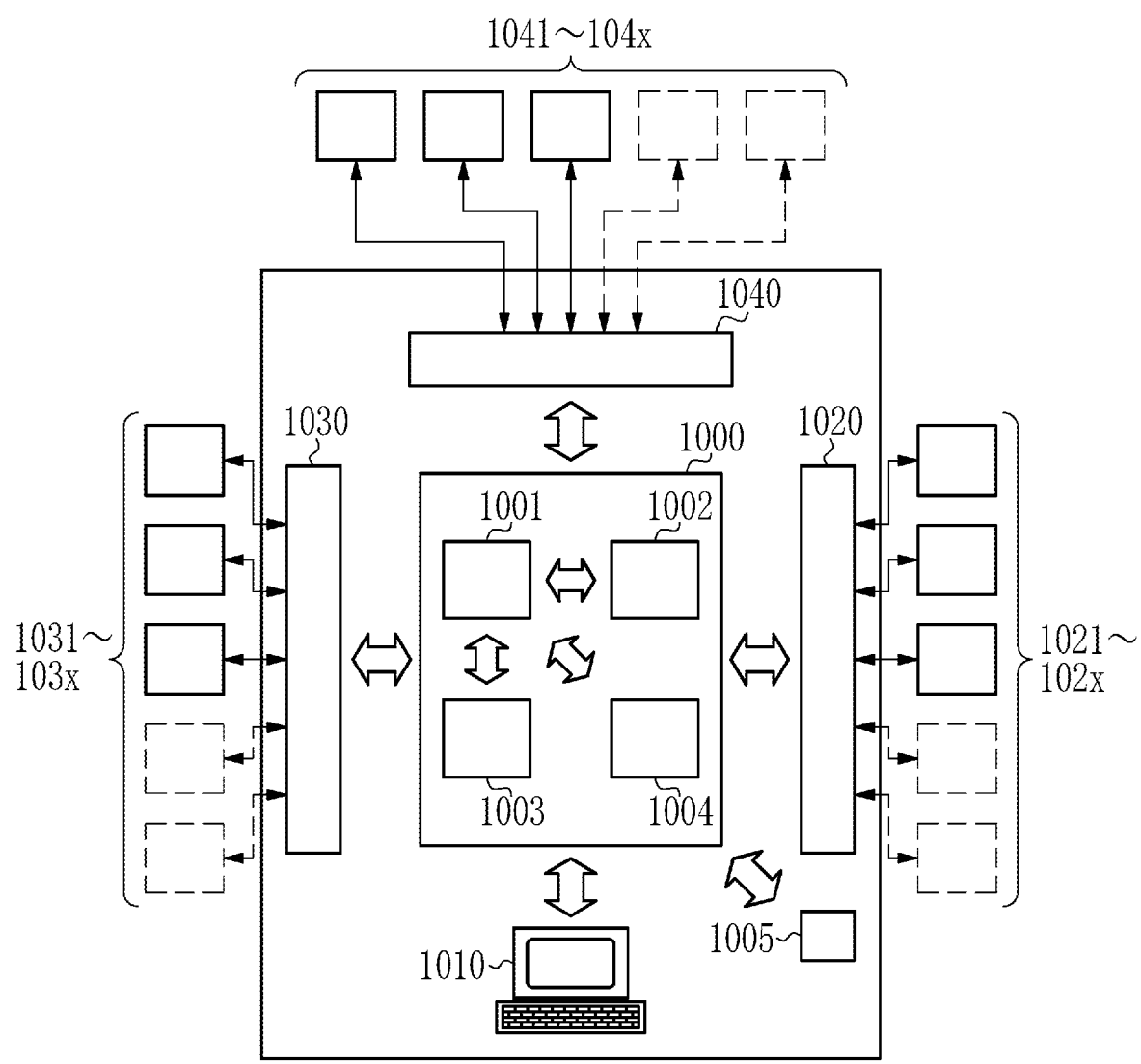
FIG. 29 is a block diagram illustrating a schematic configuration of a control unit.

FIG. 29 is a block diagram illustrating a schematic configuration of a control unit. The control units in the above-described embodiments, including the laser control unit 20, the wavelength control unit 21, the spectral linewidth calculator 22, and the synchronization control unit 65, may be constituted of a universal control device such as a computer and a programmable controller. For example, the control units may be configured as described below.

8.1 Configuration

The control unit may include a processing unit 1000, a storage memory 1005, a user interface 1010, a parallel input/output (I/O) controller 1020, a serial I/O controller 1030, and an analog-to-digital (AD) and digital-to-analog (DA) converter 1040, which are connected to the processing unit 1000. The processing unit 1000 may include a central processing unit (CPU) 1001, a memory 1002, a timer 1003, and a graphics processing unit (GPU) 1004, which are connected to the CPU 1001

8.2 Operation

The processing unit 1000 may read out programs stored in the storage memory 1005. The processing unit 1000 may execute the read programs, may read out data from the storage memory 1005 in accordance with the execution of the programs, or store data in the storage memory 1005.

The parallel I/O controller 1020 may be connected to devices 1021 to 102x which are communicable through parallel I/O ports. The parallel I/O controller 1020 may control communication using digital signals through the parallel I/O ports performed in the process where the processing unit 1000 executes the programs.

The serial I/O controller 1030 may be connected to devices 1031 to 103x communicable through serial I/O ports. The serial I/O controller 1030 may control communication using digital signals through the serial I/O ports performed in the process where the processing unit 1000 executes the programs.

The AD/DA converter 1040 may be connected to devices 1041 to 104x communicable through analog ports. The AD/DA converter 1040 may control communication using analog signals through the analog ports performed in the process where the processing unit 1000 executes the programs.

The user interface 1010 may be configured to display the progress of the program executed the processing unit 1000 to an operator or accept instructions from the operator to the processing unit 1000 to stop execution of the program or to execute interruptive processing.

The CPU 1001 of the processing unit 1000 may perform arithmetic processing of the programs. In the process where the CPU 1001 executes the programs, the memory 1002 may temporally store the programs or temporally store data in the arithmetic processing. The timer 1003 may measure time points or time durations and output the time points or the time durations to the CPU 1001 in accordance with the execution of the programs. When image data is input to the processing unit 1000, the GPU 1004 may process the image data in accordance with the execution of the programs and output the results to the CPU 1001.

The devices 1021 to 102x, which are connected to the parallel I/O controller 1020 and communicable through the parallel I/O ports, may be used for receiving or sending signals such as the trigger signal from the exposure apparatus control unit 40, a signal indicating timing, and signals from other control units.

The devices 1031 to 103x, which are connected to the serial I/O controller 1030 and communicable through the serial I/O ports, may be the used for receiving or sending data between control units such as the exposure apparatus control unit 40 and other control units.

The devices 1041 to 104x, which are connected to the AD/DA converter 1040 and communicable through the analog ports, may be various types of sensors such as the energy sensor 17 and the line sensors 18d and 19d. With the above-described configuration, the control unit may be capable of achieving the operations indicated in the embodiments.

The foregoing description is intended to be merely illustrative rather than limiting. It should therefore be appreciated for a person skilled in the art that variations on the embodiments of the present disclosure may be made without departing from the scope as defined by the appended claims.

The terms used throughout the specification and the appended claims are to be construed as "open-ended" terms. For example, the term "include" or "included" is to be construed as "including but not limited to". The term "have" is to be construed as "having but not limited to". Also, the modifier "one (a/an)" described in the specification and recited in the appended claims is to be construed to mean "at least one" or "one or more".

What is claimed is:

1. A narrowband laser apparatus, comprising:
a laser resonator including optical elements for narrowing a spectral linewidth;
a spectrometer configured to detect spectral intensity distributions of multiple pulses included in a pulsed laser beam output from the laser resonator;
a spectral waveform producer configured to produce a spectral waveform by adding up the spectral intensity distributions of the multiple pulses;
a device function storage configured to store a device function of the spectrometer;
a wavelength frequency function generator configured to generate a wavelength frequency function which represents a frequency distribution of center wavelengths of the multiple pulses;
a deconvolution processor configured to perform deconvolution processing on the spectral waveform with the device function and the wavelength frequency function; and
a spectral linewidth calculator configured to calculate a spectral linewidth on the basis of a restored spectral waveform calculated by the deconvolution processor.

2. The narrowband laser apparatus set forth in claim 1, wherein the deconvolution processor performs the deconvolution processing with a synthetic function which is obtained through convolution processing on the device function and the wavelength frequency function.

3. A narrowband laser apparatus, comprising:
a laser resonator including optical elements for narrowing a spectral linewidth;
a spectrometer configured to detect spectral intensity distributions of multiple pulses included in a pulsed laser beam output from the laser resonator;
a spectral waveform producer configured to produce a spectral waveform by adding up the spectral intensity distributions of the multiple pulses;
a device function storage configured to store a device function of the spectrometer;
a wavelength frequency function generator configured to generate a wavelength frequency function which represents a frequency distribution of center wavelengths of the multiple pulses;
a deconvolution processor configured to perform deconvolution processing on the spectral waveform with the device function and the wavelength frequency function; and
a center wavelength measuring unit configured to measure the center wavelength of each of the pulses, wherein the wavelength frequency function generator generates the wavelength frequency function on the basis of the center wavelengths measured by the center wavelength measuring unit.

4. The narrowband laser apparatus set forth in claim 3, wherein the center wavelength is any one of a mean value of half-power wavelengths, a peak wavelength, and a centroidal wavelength.

5. A narrowband laser apparatus, comprising:
a laser resonator including optical elements for narrowing a spectral linewidth;
a spectrometer configured to detect spectral intensity distributions of multiple pulses included in a pulsed laser beam output from the laser resonator;
a spectral waveform producer configured to produce a spectral waveform by adding up the spectral intensity distributions of the multiple pulses;
a device function storage configured to store a device function of the spectrometer;
a wavelength frequency function generator configured to generate a wavelength frequency function which represents a frequency distribution of center wavelengths of the multiple pulses;
a deconvolution processor configured to perform deconvolution processing on the spectral waveform with the device function and the wavelength frequency function; and
a control unit configured to obtain a target center wavelength from an exposure apparatus, the target center wavelength being used for controlling the center wavelength of each of the pulses, wherein the wavelength frequency function generator generates the wavelength frequency function on the basis of the target center wavelength.

6. The narrowband laser apparatus set forth in claim 5, wherein a wavelength change amount between the target center wavelengths of the multiple pulses is at least twice a section width of the wavelength frequency function.

7. The narrowband laser apparatus set forth in claim 6, wherein the section width is more than 0 and not more than 7 fm.

8. The narrowband laser apparatus set forth in claim 1, wherein, the spectrometer includes a sensor configured to output integrated data on an integrated value of the spectral intensity distributions every time the sensor detects the spectral intensity distributions a first number of times, and to perform the outputting a second number of times; and
the spectral waveform producer produces the spectral waveform on the basis of integrated average data provided by averaging the integrated data having been output the second number of times.

9. The narrowband laser apparatus set forth in claim 8, wherein each of the first number and the second number is not less than 1, and a third number being a product of the first number and the second number is not less than 2.

10. The narrowband laser apparatus set forth in claim 1, further comprising an energy sensor configured to detect pulse energy of each of the pulses, wherein the wavelength frequency function producer produces the wavelength frequency function by calculating the sum of the pulse energy for each wavelength section.

11. The narrowband laser apparatus set forth in claim 1, further comprising a spectral linewidth control unit configured to control a spectral linewidth of the pulsed laser beam on the basis of the spectral linewidth calculated by the spectral linewidth calculator.

* * * * *